United States Patent
Chen et al.

(10) Patent No.: US 10,949,769 B2
(45) Date of Patent: Mar. 16, 2021

(54) CO-PLANAR WAVEGUIDE FLUX QUBITS

(71) Applicant: Google LLC, Mountain View, CA (US)

(72) Inventors: Yu Chen, Mountain View, CA (US); John Martinis, Mountain View, CA (US); Daniel Thomas Sank, Mountain View, CA (US); Alireza Shabani Barzegar, Los Angeles, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/849,363

(22) Filed: Apr. 15, 2020

(65) Prior Publication Data

US 2020/0242503 A1 Jul. 30, 2020

Related U.S. Application Data

(63) Continuation of application No. 15/764,021, filed as application No. PCT/US2015/053166 on Sep. 30, 2015, now Pat. No. 10,650,320.

(51) Int. Cl.
| | |
|---|---|
| *G06N 10/00* | (2019.01) |
| *H01P 3/00* | (2006.01) |
| *G06F 13/40* | (2006.01) |
| *H01L 39/02* | (2006.01) |

(52) U.S. Cl.
CPC ......... *G06N 10/00* (2019.01); *G06F 13/4068* (2013.01); *H01L 39/025* (2013.01); *H01P 3/003* (2013.01)

(58) Field of Classification Search
CPC ... G06N 10/00; G06F 13/4068; H01L 39/025; H01P 3/003
See application file for complete search history.

(56) References Cited

U.S. PATENT DOCUMENTS

| | | | | |
|---|---|---|---|---|
| 4,761,611 A | * | 8/1988 | Hoenig | G01R 33/0358 324/248 |
| 5,523,686 A | | 6/1996 | Kirtley et al. | |
| 5,656,937 A | * | 8/1997 | Cantor | G01R 33/0354 324/248 |
| 6,242,939 B1 | | 6/2001 | Nagasawa et al. | |

(Continued)

FOREIGN PATENT DOCUMENTS

| | | |
|---|---|---|
| JP | H09-083025 | 3/1997 |
| JP | H11-211798 | 8/1999 |

(Continued)

OTHER PUBLICATIONS

AU Office Action in Australian Application No. 2015410654, dated Aug. 26, 2019, 5 pages.

(Continued)

*Primary Examiner* — Steven H Loke
*Assistant Examiner* — Juanita B Rhodes
(74) *Attorney, Agent, or Firm* — Fish & Richardson P.C.

(57) ABSTRACT

A qubit device includes an elongated thin film uninterrupted by Josephson junctions, a quantum device in electrical contact with a proximal end of the elongated thin film, and a ground plane that is co-planar with the elongated thin film and is in electrical contact with a distal end of the elongated thin film, in which the thin film, the quantum device, and the ground plane comprise a material that is superconducting at a designed operating temperature.

13 Claims, 19 Drawing Sheets

(56) References Cited

U.S. PATENT DOCUMENTS

| | | | |
|---|---|---|---|
| 2009/0008632 A1* | 1/2009 | Bunyk | H01L 27/18 257/31 |
| 2009/0289638 A1* | 11/2009 | Farinelli | G06N 10/00 324/652 |
| 2014/0167836 A1* | 6/2014 | Gambetta | G06N 10/00 327/528 |
| 2015/0349780 A1 | 12/2015 | Naaman | |
| 2016/0112031 A1* | 4/2016 | Abraham | H03K 19/1954 327/528 |
| 2016/0292586 A1 | 10/2016 | Rigetti | |
| 2017/0148972 A1 | 5/2017 | Thompson | |

FOREIGN PATENT DOCUMENTS

| | | |
|---|---|---|
| JP | 2004-158721 | 6/2004 |
| JP | 2011-524026 | 8/2011 |
| JP | 2011-524043 | 8/2011 |
| JP | 2015-525426 | 9/2015 |
| TW | I334491 | 12/2010 |
| WO | WO 2009/143166 | 11/2009 |
| WO | WO 2013/006836 | 1/2013 |
| WO | WO 2013/180946 | 12/2013 |
| WO | WO 2015/143439 | 9/2015 |

OTHER PUBLICATIONS

AU Office Action issued in Australian Application No. 2015410654, dated Jun. 25, 2019, 8 pages.

AU Office Action issued in Australian Application No. 2015410654, dated Oct. 25, 2018, 3 pages.

Barends et al. "Coherent Josephson qubit suitable for scalable quantum integrated circuits," Physical Review Letters, vol. 111, 080502, Aug. 22, 2013, 9 pages.

CA Office Action issued in Canadian Application No. 2984487, dated Aug. 2, 2018, 6 pages.

CA Office Action issued in Canadian Application No. 2984487, dated Jan. 30, 2020, 7 pages.

Clarke et al. "Superconducting quantum bits," Nature, vol. 453, Jun. 19, 2008, 12 pages.

Inomata et al. "Large dispersive shift of cavity resonance induced by a superconducting flux qubit in the straddling regime," Physical Review B, col. 86, 140508R. Oct. 26, 2012, 9 pages.

Johansson et al. "The dynamical Casimir effect in a superconducting coplanar waveguide," arXiv 0906.3127v1, Jun. 17, 2009, 4 pages.

JP Office Action in Japanese Application No. 2017-556923, dated Aug. 19, 2019, 10 pages (with English translation).

JP Office Action issued in Japanese Application No. 2017-556923, dated Dec. 17, 2018, 10 pages (with English translation).

Jung et al. "Low-loss tunable metamaterials using superconducting circuits with Josephson junctions," Applied Physics Letters vol. 102(062601) Jan. 4, 2013, 4 pages.

Kelly, "Fault-tolerant superconducting qubits," Thesis for the degree of Doctor of Philosophy, University of California Santa Barbara, Mar. 2015, 207 pages.

PCT International Preliminary Report on Patentability issued in International Application No. PCT/US2015/053166, dated Apr. 12, 2018, 9 pages.

PCT International Search Report and Written Opinion issued in International Application No. PCT/US2015/053166, dated Jun. 23, 2016, 13 pages.

Satoh et al. "Fabrication of superconducting qubits with Al trilayer Josephson junctions," IEEE Transactions on Applied Superconductivity, vol. 25(3) Dec. 4, 2014, 5 pages.

SG Search Report and Written Opinion issued in Singaporean Application No. 11201708801x dated Jul. 2, 2018, 10 pages.

SG Written Opinion in Singaporean Appln. No. 11201708801X, dated Dec. 9, 2019, 6 pages.

TW Decision in Taiwanese Application No. 107101577, dated Jul. 30, 2019, 6 pages (with English translation).

TW Office Action issued in Taiwanese Application No. 105131813, dated Aug. 11, 2017, 6 pages (English translation).

TW Office Action issued in Taiwanese Application No. 107101577, dated Mar. 6, 2019, 13 pages (English translation).

Xiang et al. "Hybrid quantum circuits: superconducting circuits interacting with other quantum systems," Reviews of Modern Physics, vol. 85(2) Apr. 9, 2013, 16 pages.

Yan et al. "The Flux qubit revisited," arXiv 1508.06299v1, Aug. 25, 2015, 53 pages.

* cited by examiner

CO-PLANAR WAVEGUIDE FLUX QUBITS

CROSS-REFERENCE TO RELATED APPLICATION

This application is a continuation of U.S. application Ser. No. 15/764,021, filed Mar. 28, 2018, which is a National Stage Application under 35 U.S.C. §371 and claims the benefit of International Application No. PCT/US2015/053166, filed Sep. 30, 2015. The disclosure of the foregoing application is hereby incorporated by reference in its entirety.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|0\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

The present disclosure relates to co-planar waveguide flux qubits. In general, in a first aspect, the subject matter of the present disclosure may be embodied in a qubit device that includes an elongated thin film uninterrupted by Josephson junctions, a quantum device (e.g., a superconducting quantum interference device (SQUID)) in electrical contact with a proximal end of the elongated thin film, and a ground plane that is co-planar with the elongated thin film and is in electrical contact with a distal end of the elongated thin film, in which the thin film, the quantum device, and the ground plane comprise a material that is superconducting at a designed operating temperature.

Implementations of the device can optionally include one or more of the following features, alone or in combination. For example, in some implementations, the elongated thin film includes a first side and a second opposite side and each of the first side and the second side is separated from the superconducting ground plane by a respective gap. A width of each respective gap may be constant along the length of the elongated thin film.

In some implementations, each of the elongated thin film, the superconducting loop, and the ground-plane includes aluminum or niobium.

In some implementations, the quantum device includes a superconducting loop interrupted by at least one Josephson junction. The quantum device may include only two Josephson junctions interrupting the superconducting loop.

In some implementations, the qubit further includes a substrate, in which the elongated thin film, the ground plane and the quantum device are on a surface of the substrate. The substrate may include sapphire.

In some implementations, the elongated thin film includes a first section extending along a first direction and a second section extending along a second different direction.

In general, in another aspect, the subject matter of the present application can be embodied in a qubit device that includes an elongated thin film uninterrupted by Josephson junctions and includes a first section extending along a first direction and a second section extending along a second direction, a quantum device (e.g., SQUID) in electrical contact with the elongated thin film at a position between the first and second section, and a ground plane that is co-planar with the elongated thin film and is in electrical contact with the elongated thin film, in which the thin film, the quantum device, and the ground plane include a material that is superconducting at a designed operating temperature.

In general, in another aspect, the subject matter of the present application can be embodied in a qubit control system that includes a qubit device having (a) an elongated thin film uninterrupted by Josephson junctions, (b) a quantum device (e.g., a SQUID) in electrical contact with a proximal end of the elongated thin film, and (c) a ground plane that is co-planar with the elongated thin film and is in electrical contact with a distal end of the elongated thin film, in which the thin film, the quantum device, and the ground plane including a material that is superconducting at a designed operating temperature. The qubit control system further includes a qubit bias control device adjacent to the elongated thin film such that the qubit bias control device is inductively coupled to the elongated thin film during operation, and a quantum device bias control device adjacent to the quantum device of the qubit device such that the quantum device bias control device is inductively coupled to the quantum device during operation.

Implementations of the device can optionally include one or more of the following features, alone or in combination. For example, in some implementations, the qubit bias control device is in electrical contact with the elongated superconducting thin film.

In some implementations, the qubit bias control device includes a current divider. The current divider may include multiple inductors. The current divider may include a center thin film trace, and an outer thin film trace forming an open loop that circumscribes the center thin film trace and that is in electrical contact with the elongated thin film, in which an end of the center thin film trace is in electrical contact with the outer thin film trace at a plurality of different locations along the open loop.

In some implementations, the quantum device bias control device can include an inner thin film loop and an outer thin film loop that at least partially circumscribes the inner thin film loop and that is in electrical contact with the quantum device.

In some implementations, the qubit bias control device has a mutual inductance with the elongated thin film of between about 0.1 pH and 0.2 pH.

In some implementations, the quantum device bias control device has a mutual inductance with the quantum device of about 0 pH.

In general, in another aspect, the subject matter of the present disclosure relates to a quantum processor that includes multiple co-planar waveguide flux qubit devices, each co-planar waveguide flux qubit device having (a) an elongated thin film waveguide uninterrupted by Josephson junctions, (b) a quantum device (e.g., a SQUID) in electrical contact with a first end of the elongated thin film waveguide, and (c) a ground plane that is co-planar with the elongated thin film waveguide and is in electrical contact with the elongated thin film, in which each co-planar waveguide flux qubit device is operatively coupled to each other co-planar waveguide flux qubit device in the quantum processor.

Implementations of the device can optionally include one or more of the following features, alone or in combination. For example, in some implementations, the elongated thin film waveguide of each co-planar waveguide flux qubit crosses multiple elongated thin film waveguides associated with other co-planar waveguide flux qubits in the processor. The quantum processor may further include multiple inductive couplers, in which each inductive coupler is arranged adjacent to a crossing between two elongated thin film waveguides associated with different co-planar waveguide flux qubits.

The subject matter of the present disclosure may have various advantages. For example, in some implementations, the co-planar waveguide flux qubit may exhibit relatively long decoherence times. Without wishing to be bound by theory, it is believed the improved decoherence time is due, in part, to the co-planar waveguide flux qubit utilizing primarily a single layer of superconducting material to form the flux qubit. By using a single layer of superconducting material on the substrate, sources of decoherence that would otherwise exist due to additional material layers are removed. Similarly, it is believed that the dielectric materials normally used to form the Josephson junctions are also strong sources of decoherence in flux qubits. Thus, by replacing the third Josephson junction in a persistent current flux qubit with the co-planar waveguide, an additional source of decoherence is eliminated, and the decoherence time associated with the qubit can be substantially increased.

In addition, the co-planar waveguide flux qubit allows, in some implementations, for coupling to a greater number of qubits. In particular, coupling with the co-planar waveguide flux qubit is accomplished through inductive coupling to the waveguide portion of the qubit. Since the waveguide distributes its inductance and capacitance over a macroscopic length (several mm), the number of qubits to which one can couple can be substantially increased.

The use of two or more co-planar waveguides with a flux qubit may offer various advantages as well. For example, in certain implementations, the use of two or more symmetrical co-planar waveguides within a flux qubit give rise to stronger $\sigma_x \sigma_x$ between qubits. Furthermore, by separating the measurement and bias connections, the amount of cross talk may be reduced. Additionally, the use of two or more co-planar waveguides per qubit can increase the number of coupled qubits in a fully connected graph, in some cases at least doubling the number of coupled qubits.

Furthermore, by adjusting certain geometrical aspects of the control device, it is possible, in some implementations, to improve coupling of the control device to the flux qubit or the quantum device, reduce crosstalk/coupling with the qubit bias control device as well as other qubits in a connected network, and reduce sources of decoherence.

The details of one or more embodiments are set forth in the accompanying drawings and the description below. Other features and advantages will be apparent from the description, the drawings, and the claims.

DETAILED DESCRIPTION

Figure 1B:
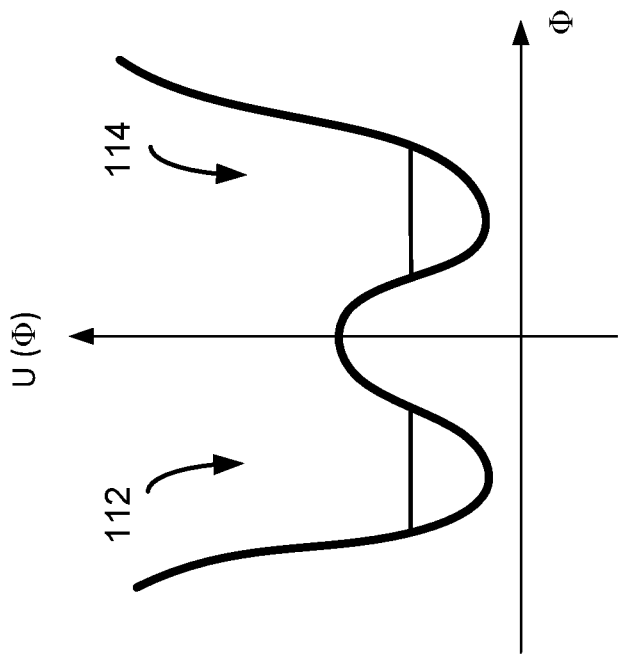
FIG. 1B is a plot illustrating a double-well potential for the superconducting phase qubit of FIG. 1A.
Figure 1A:
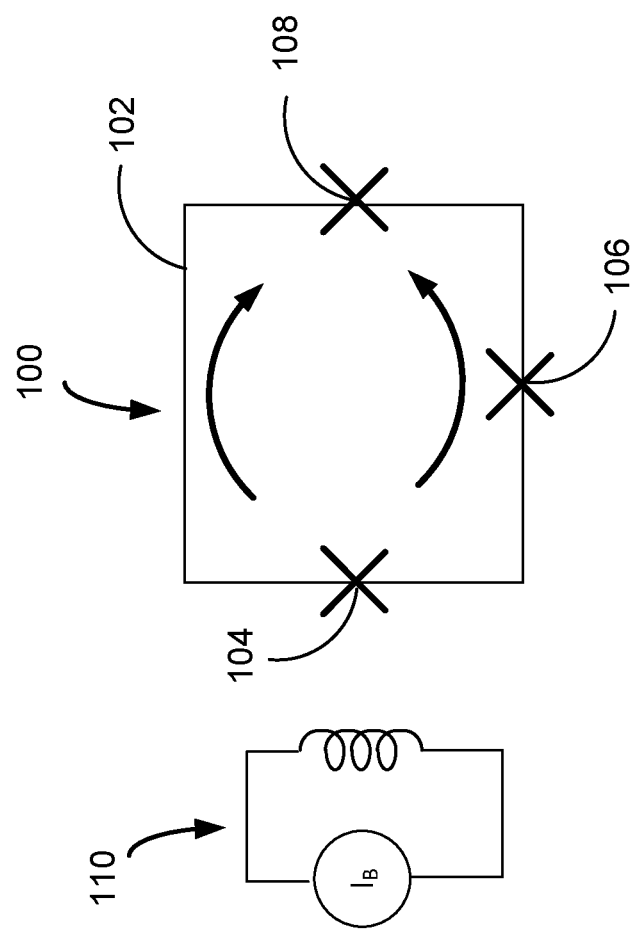
FIG. 1A is a schematic that illustrates an example of a superconducting phase qubit.

A flux qubit is an example of a qubit that can be realized in a physical system using superconducting materials. Flux qubits store information in the phase or flux states of the device. An example of a flux qubit is the persistent current qubit that includes a loop of superconducting material interrupted by three Josephson junctions. FIG. 1A is a schematic that illustrates an example of a persistent current flux qubit 100. The persistent current flux qubit 100 includes a loop 102 of superconducting material interrupted by multiple Josephson junctions 104, 106, and 108. Each Josephson junction has a certain critical current.

During operation of the qubit 100, a source 110 may be used to introduce a magnetic flux $\Phi_x$ to the qubit 100. The magnetic flux can be expressed as $B\Phi_0$, where $\Phi_0$, is the flux quantum and B is a dimensionless number. With the application of the magnetic flux $\Phi_x$, the qubit 100 exhibits a two-dimensional potential with respect to the phase across the Josephson junctions. The two-dimensional potential may include regions of local energy minima that are separated from one another by a relatively low energy barrier and from other regions by relatively large energy barriers. An example of such a double-well potential is shown in FIG. 1B. The left well 112 represents current circulating in one direction through the loop of qubit 100 (e.g., clockwise), whereas the right well 114 represents current traveling in an opposite direction through the loop (e.g., counter-clockwise). When the wells 112 and 114 exhibit the same or close to the same potential energy, as shown in FIG. 1B, the two different states (clockwise and counter-clockwise persistent currents through the superconducting loop) of the qubit 100 can be said to be in superposition.

Quantum computing entails coherently processing quantum information stored in the qubits of a quantum computer. In particular, the qubits of a quantum computer are coupled together in a controllable manner such that the quantum state of each qubit affects the corresponding quantum states of the qubits to which it is coupled. The computing power of a quantum computer can be significantly improved by increasing the number of other qubits to which one can couple. For certain designs, such as persistent current flux qubits, the number of qubits available for coupling is limited to a qubit's nearest neighbors. Furthermore, interaction with other qubits supplies a potentially strong source of decoherence, leading to lower qubit decoherence times. Decoherence time corresponds to the duration of time it takes for a qubit to lose some of its quantum mechanical properties, e.g., the qubit is no longer characterized by a superposition of basis states and the qubit cannot be used in quantum computation. Another source of decoherence includes noise generated from the materials used to construct a qubit, such as the dielectrics forming the Josephson junctions. Due to these effects, flux qubits may have short decoherence times, e.g., on the order of 10 ns.

Overview

In general, in some aspects, the subject matter of the present disclosure encompasses a flux qubit that includes at least one elongated co-planar waveguide resonator coupled to a superconducting quantum interference device. The elongated co-planar waveguide serves as a parallel LC resonant circuit that determines the energy levels of the qubit. Because of its relatively simplified structure and the elimination of materials that function as sources of decoherence, the co-planar waveguide flux qubit can exhibit substantial improvement in decoherence times. Furthermore, because the waveguide can be fabricated to have a relatively long length while maintaining the ability to strongly couple to other qubits, the co-planar waveguide flux qubit can be used to couple to large numbers of other qubits in a connected quantum network.

In some aspects, the subject matter of the present disclosure also encompasses a control system for the co-planar waveguide flux qubit, in which the control system includes a qubit bias control device and a quantum device bias control device (e.g., a SQUID bias control device). The qubit bias control device may include a current divider that is tuned to optimize its mutual inductance with the co-planar waveguide of the flux qubit, which leads to substantially longer decoherence times. The quantum device bias control device may include relatively concentric loops of superconducting thin films arranged adjacent to the flux qubit. Varying different geometrical aspects of the control device can improve coupling of the control device to the flux qubit or to the quantum device (e.g., a SQUID), can reduce crosstalk/coupling with the qubit bias control device as well as other qubits in a connected network, and can reduce sources of decoherence.

In some aspects, the subject matter of the present disclosure also encompasses a connected quantum network of co-planar waveguide flux qubit devices. The network may have a modular design, in which, for each qubit, the number of other qubits available for coupling can be added or removed along the length of the co-planar waveguide. Furthermore, in some implementations, the connected quantum network may employ flux qubit designs having multiple co-planar waveguides, each of which can be used to couple to other qubits in the network. The additional waveguides thus provide options for increasing the number of qubits with which one can couple and offer greater flexibility in designing the connected quantum network.

Co-planar Waveguide Flux Qubit

Figure 2A:
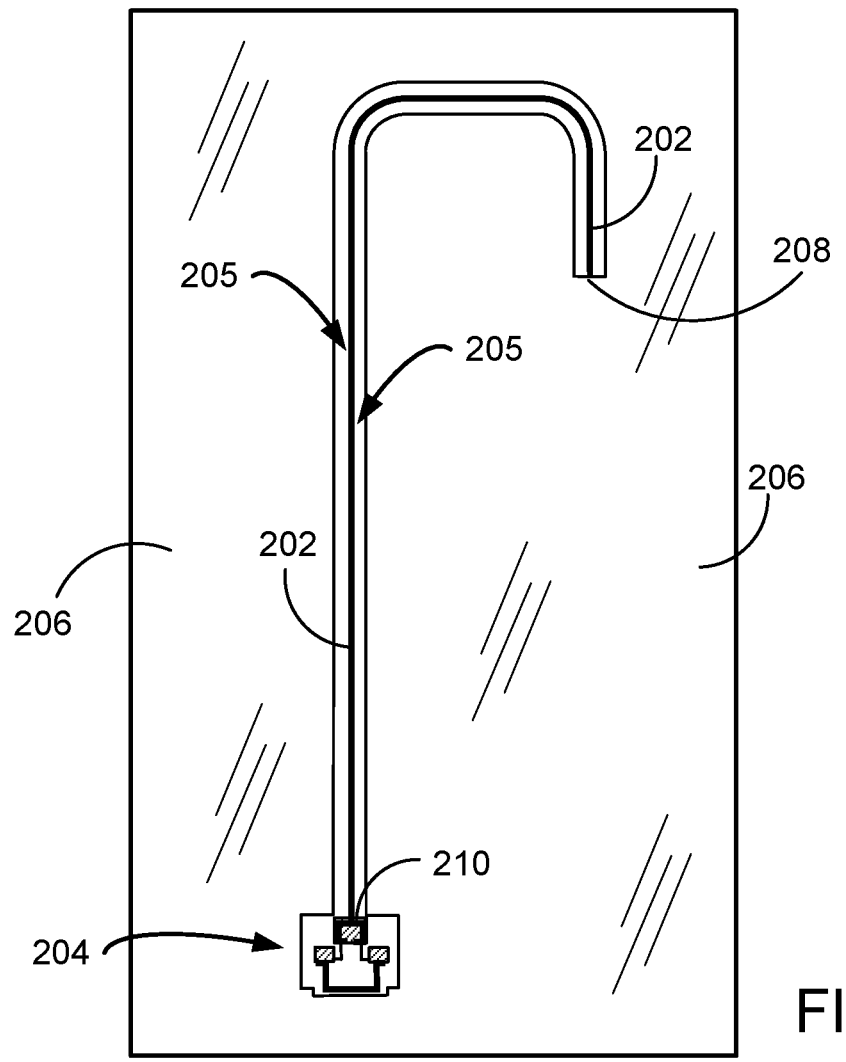
FIG. 2A is a schematic illustrating a top view of an example of a co-planar waveguide flux qubit.

FIG. 2A is a schematic illustrating a top view of an example of a co-planar waveguide flux qubit 200. Qubit 200 includes a co-planar waveguide 202 that is coupled to a quantum device 204. The quantum device 204 can include, but is not limited to, superconducting quantum interference devices (SQUIDS). In the present example, the quantum device 204 is a DC-superconducting quantum interference device (DC-SQUID), though other SQUID devices may be used. The co-planar waveguide 202 and DC-SQUID 204 are surrounded by and are in electrical contact with a ground plane 206. Each of waveguide 202, DC-SQUID 204 and ground plane 206 is formed from a superconducting thin film material using standard thin film fabrication processes on a dielectric substrate. Waveguide 202 is arranged on the substrate as an elongated thin film, in which one end 208 of the thin film is in electrical contact with the ground plane 206 and another opposite end 210 of the thin film is in electrical contact with DC-SQUID 204. The elongated sides of the waveguide 202 are separated from the ground-plane 206 by corresponding gaps 205. In the present example, the width of each respective gap 205 is constant along the length of the elongated waveguide, e.g., to avoid unnecessary reflection of the electromagnetic wave. The desired mode profile of a waveguide is the symmetric co-planar waveguide (CPW) mode, with the two ground planes on either side of the center trace held to the same voltage. In some implementations, the waveguide 202 may have a length (measured along the elongated sides) of up to about several thousands micrometers, and a width (as measured transverse to the length) of up to about several tens of micrometers. The thickness of the deposited film forming the waveguide 202 (as well as the ground plane 206 and portions of the DC-SQUID) may be, e.g., on the order of 100 to 200 nm.

Figure 2B:
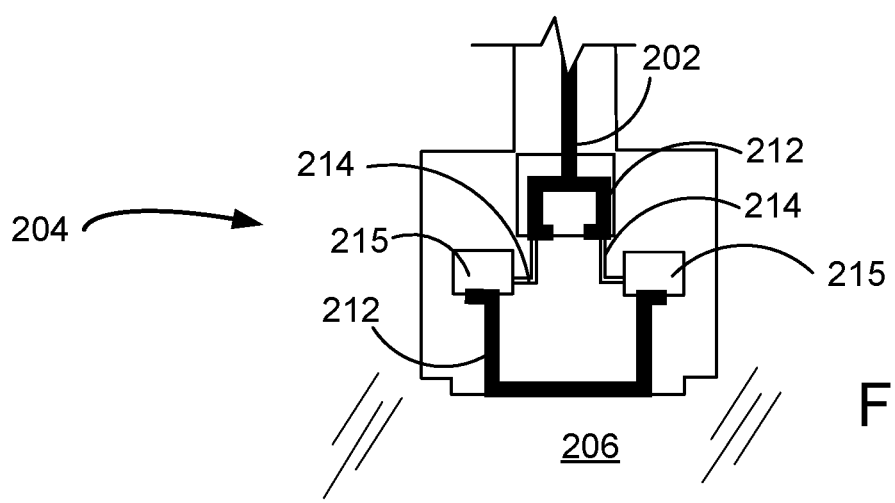
FIG. 2B is a schematic illustrating a close-up view of a Superconducting Quantum Interference Device (SQUID) used in the co-planar waveguide flux qubit from FIG. 2A.

In some implementations, the end of the waveguide 202 furthest from the DC-SQUID has a hook shape so as to provide a region for inductively coupling the qubit to a readout device (not shown). FIG. 2B is a schematic illustrating a close-up view of DC-SQUID 204 coupled to waveguide 202. DC-SQUID 204 includes a loop 212 of superconducting material that is interrupted by two Josephson junctions 214, each of which can be formed from a thin-film non-superconducting/insulating material. For example, the Josephson junctions 214 may be formed from a tri-layer of $Al/Al_2O_3/Al$ thin films. Thus, the Josephson junctions 214 are coupled in parallel with one another, with a first common node in electrical contact with the waveguide 202 and a second common node in electrical contact with the ground plane 206. The Josephson junctions 214 are electrically connected to the loop 212 through contact pads 215 that may be formed from the same or different superconducting material as the loop 212. In some implementations, the contact pads 215 are absent and the Josephson junctions 214 are in direct physical and electrical contact with the loop 212. Each of waveguide 202, DC-SQUID 204, and ground-plane 206 may be formed from materials exhibiting superconducting properties at or below a superconducting critical temperature, such as aluminum (superconducting critical temperature of 1.2 kelvin) or niobium (superconducting critical temperature of 9.3 kelvin). The substrate on which the waveguide 202, DC-SQUID 204 and ground-plane 206 are formed includes a dielectric material such as, e.g., sapphire, $SiO_2$ or Si. In some implementations, sapphire provides an advantage of low dielectric loss, thus leading to higher decoherence times.

Figure 2C:
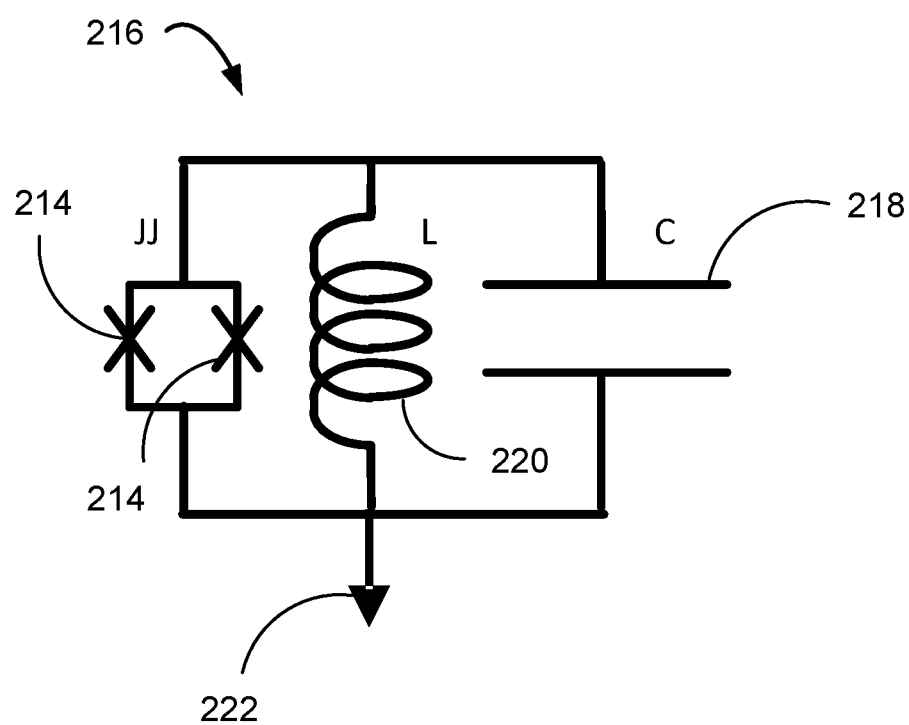
FIG. 2C is a schematic illustrating a circuit diagram representative of the co-planar waveguide flux qubit of FIG. 2A.

Co-planar waveguide flux qubit 200 may operate, in some implementations, in a similar manner to a persistent current flux qubit. That is, when a magnetic flux is introduced to the co-planar waveguide (through the control device shown in FIG. 4), two persistent current states may be generated that circulate in the co-planar waveguide loop in opposite directions. The waveguide 202 also serves as a resonator through which strong and long range coupling to other qubits may be achieved. FIG. 2C is a schematic illustrating a circuit diagram 216 representative of qubit 200. As shown in the circuit diagram 216, qubit 200 is associated with both a capacitance 218 and an inductance 220 that are coupled in parallel with the two Josephson junctions 214 provided by the DC-SQUID 204. Ground 222 in the circuit diagram 216 is provided by ground-plane 206. By comparison, a persistent current flux qubit containing three Josephson junctions interrupting a superconducting loop has the same circuit diagram as that shown in FIG. 2C. In a persistent current flux qubit, two of the Josephson junctions are equivalent to the Josephson junctions 214, whereas the third Josephson junction and the superconducting loop provide both the capacitance 218 and inductance 220. In contrast, for a co-planar waveguide flux qubit, such as qubit 200, the capacitance 218 and inductance 220 are instead provided by waveguide 202.

The co-planar waveguide flux qubit design may have several advantages relative to the persistent current flux qubit. For instance, the co-planar waveguide flux qubit may exhibit relatively long decoherence times. Without wishing to be bound by theory, it is believed the improved decoherence time is due, in part, to the co-planar waveguide flux qubit utilizing primarily a single layer of superconducting material to form the flux qubit. By using a single layer of superconducting material on the substrate, sources of decoherence that would otherwise exist due to additional material layers are removed. Similarly, it is believed that the dielectric materials normally used to form the Josephson junctions are also strong sources of decoherence in flux qubits. Thus, by replacing the third Josephson junction in a persistent current flux qubit with the co-planar waveguide, an additional source of decoherence is eliminated, and the decoherence time associated with the qubit can be substantially increased.

In addition, the co-planar waveguide flux qubit allows for coupling to a greater number of qubits. In a typical persistent current flux qubit, coupling within a quantum computer is achieved using the nearest neighbor devices, essentially limiting the number of qubits available for coupling to those that can be fit within the area around a single qubit. Because of the limited connectivity to other qubits, a quantum processor based on such a qubit design suffers from the so-called embedding problem. This means a computational problem needs to be programmed on the machine given the constraints of a Chimera graph. Solving the embedding problem can be a computationally hard task by itself, which further limits the power of quantum annealer.

In contrast, coupling with the co-planar waveguide flux qubit is accomplished through inductive coupling to the waveguide portion of the qubit. Since the waveguide distributes its inductance and capacitance over a macroscopic length (several mm), the number of qubits to which one can couple can be substantially increased, thus allowing one to potentially avoid the embedding problem. Furthermore, persistent current flux qubits typically are very small and are associated with sizes on the mesoscopic scale (e.g., having critical dimensions on the order of several microns or less). For a co-planar waveguide flux qubit, however, the structures can be fabricated to be much larger (e.g., on the order of millimeters), leading to a higher fabrication reliability.

Qubit Control System

Figure 3:
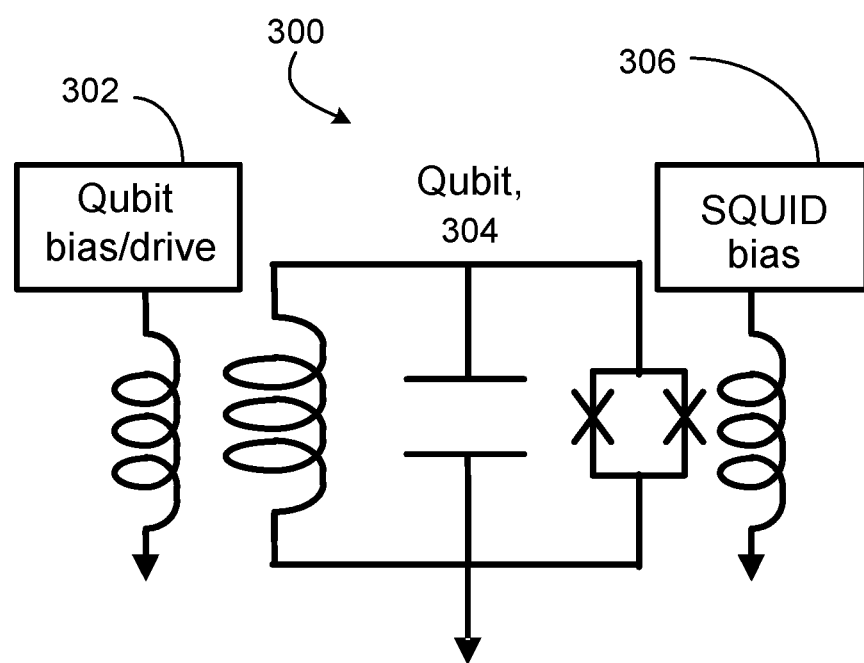
FIG. 3 is a schematic that illustrates a circuit diagram of a control system for a co-planar waveguide flux qubit device.

During operation of the co-planar waveguide flux qubit, the qubit may be exposed to different magnetic flux biases for the purpose of initializing the double well potential of the qubit, establishing superposition of the basis states, and varying the barrier between the potential wells in order to modify the probability of tunneling between states, among other actions. Such flux biases may be generated using flux bias drive devices that are arranged adjacent to the qubit device. FIG. 3 is a schematic that illustrates a circuit diagram of a control system 300 for the flux qubit device. The control system 300 includes a qubit bias control device 302 that, during operation of the qubit 304, is inductively coupled to the co-planar waveguide of the qubit 304. The qubit bias control device 302 serves to tilt/perturb the double well potential of the qubit during operation. The control system 300 also includes a SQUID bias control device 306 that, during operation of the qubit 304, is inductively coupled to the DC-SQUID. The SQUID bias control device 306 serves to tune the DC-SQUID critical current, which in turn adjusts the magnitude of the barrier potential between the wells of the qubit during operation. Since both the qubit bias control device 302 and the SQUID bias control device 306 are used during operation of the qubit 304, it is desirable, in some implementations, to reduce the cross-talk between them and other qubits in a quantum processor to avoid introducing unintended magnetic flux as well as to reduce decoherence.

Figure 4:
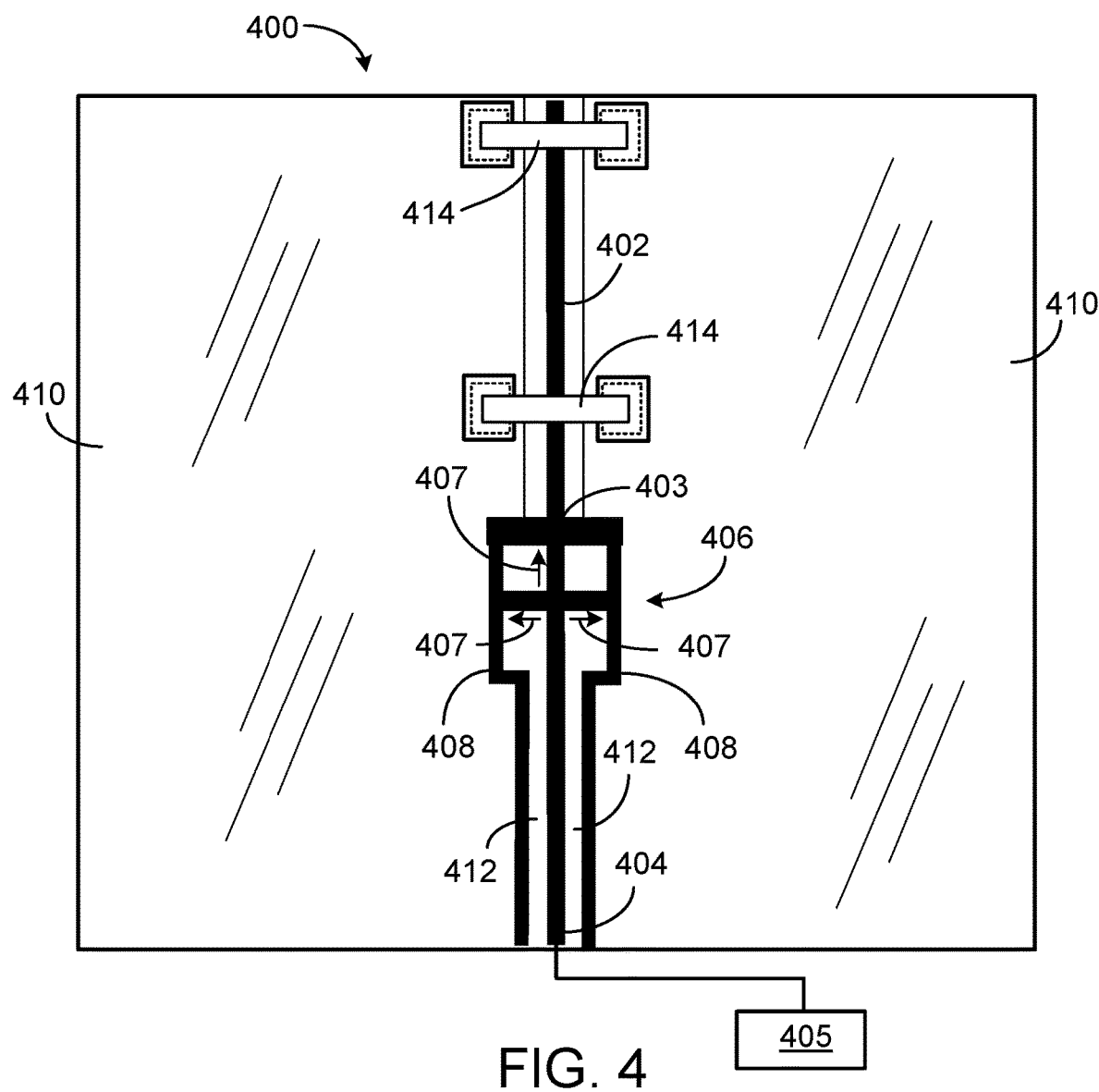
FIG. 4 is a schematic that illustrates a top view of an exemplary qubit bias control device that is coupled to an end of a co-planar waveguide.

FIG. 4 is a schematic that illustrates a top view of an exemplary qubit bias control device 400 that is coupled to an end of the co-planar waveguide 402 of a flux qubit according to the present disclosure. For ease of viewing, only a portion of the waveguide is shown. The other end of the waveguide 402 is coupled to the DC-SQUID (not shown) of the flux qubit. Qubit bias control device 400 includes a current drive line 404 that symmetrically branches along three different pathways into a current divider 406. Both the current drive line 404 and the current divider 406 are formed from a superconducting thin film on the substrate surface. For instance, the current drive line 404 and current divider 406 can be formed from the same superconducting material as the waveguide and DC-SQUID. Current is provided to the qubit bias control device 400 from a current source 405 that is coupled to the current drive line 404. The current source 405 may be fabricated on the same chip/substrate as the flux qubit or it may be an external source that is electrically coupled to the chip. The drive line 404 forms a center/inner trace of the current divider 406 and branches off along three different directions 407 to an outer thin film trace 408. The outer thin film trace 408 forms an open loop that circumscribes the center thin film trace 404. The outer thin film trace 408 is in electrical contact with the waveguide 402 at 403. An outer edge of thin film trace 408 also is in electrical contact with the ground-plane film 410. Prior to reaching the first branch of the current divider 406, the drive line 404 is separated from the outer traces 408 and thus from the ground-plane 410 by a non-conductive gap 412 on either side.

As shown in FIG. 4, the thin film branches 407 and the outer trace 408 of the current divider 406 are arranged symmetrically around a center of the drive line 404. The symmetrical structure of the current divider 406 encourages the qubit bias control device 400 to couple to the CPW mode of waveguide 402 and avoid the unwanted excitation of the slotline mode. In general, excitation of slotline modes can have parasitic effects, in which the undesired modes couple to the qubits and other elements of a quantum processor, and thus represent a source of radiation loss, decoherence and cross-talk.

In some implementations, crossover air-bridges 414 can fabricated on the device to aid in the suppression of unwanted slot-line modes from the waveguide 402 by maintaining the ground planes at the same voltage. The air-bridges 414 may be fabricated using traditional semiconductor and lithographic processing techniques. For example, the process may generally entail forming and patterning a removable resist layer over the gap in the ground-plane (to set the height and placement of the air-bridge), depositing a superconducting material over the resist (e.g., aluminum), patterning the deposited superconductor to form the bridge, and then removing any remaining resist. Though referred to as "air-bridges," the space between the bridges and the substrate corresponds to a vacuum, not air, since the device operates at temperatures associated with super-conducting materials. Additionally, though only two air-bridges 414 are shown in FIG. 4, additional air-bridges may be fabricated to cross over the co-planar waveguide 402, as well as the drive line 404 to maintain a constant voltage across the ground-plane 410.

In addition, the qubit bias control device 400 also is designed to reduce cross-talk, i.e., to enable flux-biasing of each qubit independently to avoid cross-coupling with magnetic fields to neighboring qubits, as well as with the SQUID bias control device. A precise and stable flux bias is needed because even small deviations in the applied flux may lead to a substantial asymmetry of the double well potential that prevents the correct operation of a qubit. To reduce the coupling and decoherence, the qubit bias control device 400 is designed to reliably achieve relatively high real impedance and relatively small mutual inductance. For example, the qubit bias control device 400 may be designed to provide a mutual inductance M of between about 0.1 pH and 0.2 pH. In some implementations, the qubit bias control device may be designed to provide a mutual inductance of about 1 pH or less (e.g., about 0.9 pH or less, about 0.8 pH or less, about 0.7 pH or less, about 0.6 pH or less, about 0.5 pH or less, about 0.4 pH or less, about 0.3 pH or less, about 0.2 pH or less, or about 0.1 pH or less). Through impedance transformation, the qubit bias control device 400 may be designed to provide an effective real impedance of about 10 MΩ or more. Other ranges may also be used, depending on the design criteria.

During operation of the flux qubit and qubit bias control device 400, current is supplied from the current source 405 to drive line 404. As the current reaches current divider 406 from drive line 404, the current is split along the different branches 407. The splitting of current along the different branches and back through the outer thin film trace 408 generates magnetic fields within the open areas defined by trace 408 and drive line 404. The flux generated from the magnetic fields then is coupled into the waveguide 402. Altering the current within drive line 404 will thus alter the flux delivered to the CPW mode of waveguide 402.

Figure 5:
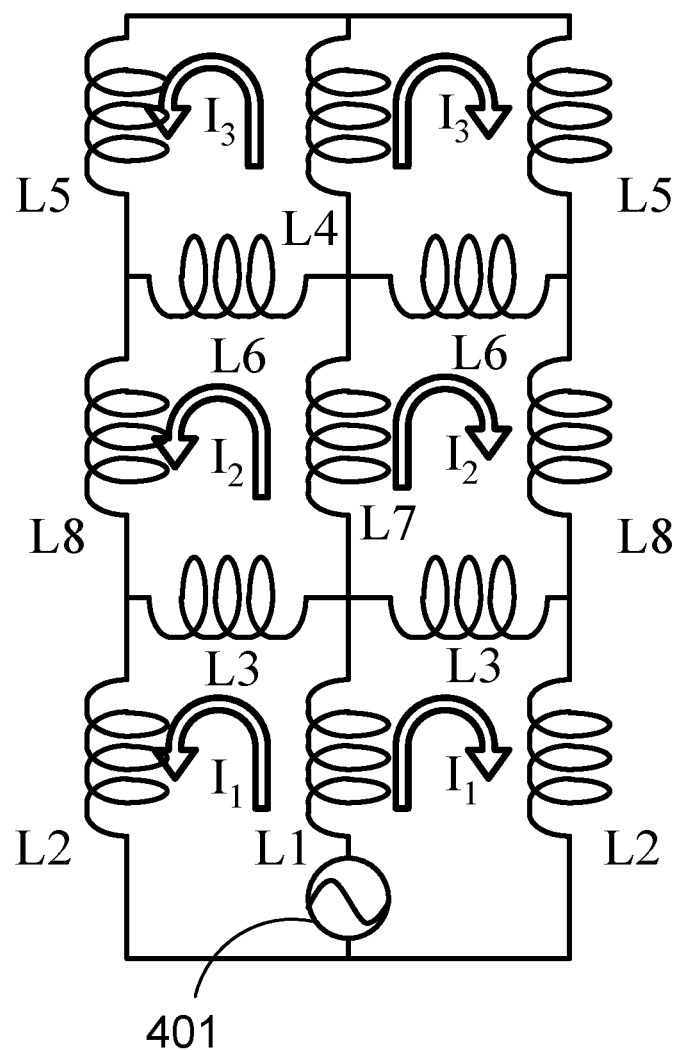
FIG. 5 is a schematic illustrating an equivalent circuit diagram for the qubit drive control device and waveguide shown in FIG. 4.

FIG. 5 is a schematic illustrating an equivalent circuit diagram for the qubit drive control device 400 and waveguide 402 shown in FIG. 4. The qubit drive control device 400 and waveguide 402 are represented as an interconnected network of inductors $L_n$, with n=1 ... 8. The inductor $L_1$ corresponds to the inductance due to the center trace/drive line 404, the inductor $L_4$ corresponds to the inductance due to the co-planar waveguide 402, the inductor $L_3$ corresponds to the inductance of the shared trace between the drive and current divider, the inductor $L_7$ corresponds to the inductance due to the center trace of the bias current divider 407, $L_2/L_8/L_5$ correspond to the inductances contributed by the ground plane, and the inductors $L_6$ correspond to the inductance of the qubit drive control device 400 at the point where the magnetic flux couples to waveguide 402. As illustrated in the schematic shown in FIG. 5, the current provided by the center trace (represented by current source 401) is distributed by the current divider to the different inductive elements, giving rise to loop currents $I_1$, $I_2$, and $I_3$. The mutual inductance of the qubit drive control device 400 can thus be expressed as follows:

$$M = \frac{(2L_4 + L_5)L_3 L_6}{(2L_4 + L_5 + L_6)\left(2L_7 + L_8 + L_3 + L_6 - \frac{L_6^2}{2L_4 + L_5 + L_6}\right)}. \quad (1)$$

Given that the waveguide 402 will typically be relatively long to allow for coupling to many other qubits, the inductance $L_4$ is generally large. Since the co-planar waveguide is much longer than the qubit control device, it is reasonable to assume that $2L_4+L_5 \gg L_6$, then equation (1) can be reduced to:

$$M = \frac{L_3 L_6}{(2L_7 + L_8 + L_3 + L_6)}. \quad (2)$$

The mutual inductance M therefore can be finely tuned by varying the inductances of the current divider 406. One possible way to modify the inductances is to vary the area of the qubit bias control device 400 by, e.g., varying the qubit bias control device height 600 and/or width 602 as shown in FIG. 6.

Figure 6:
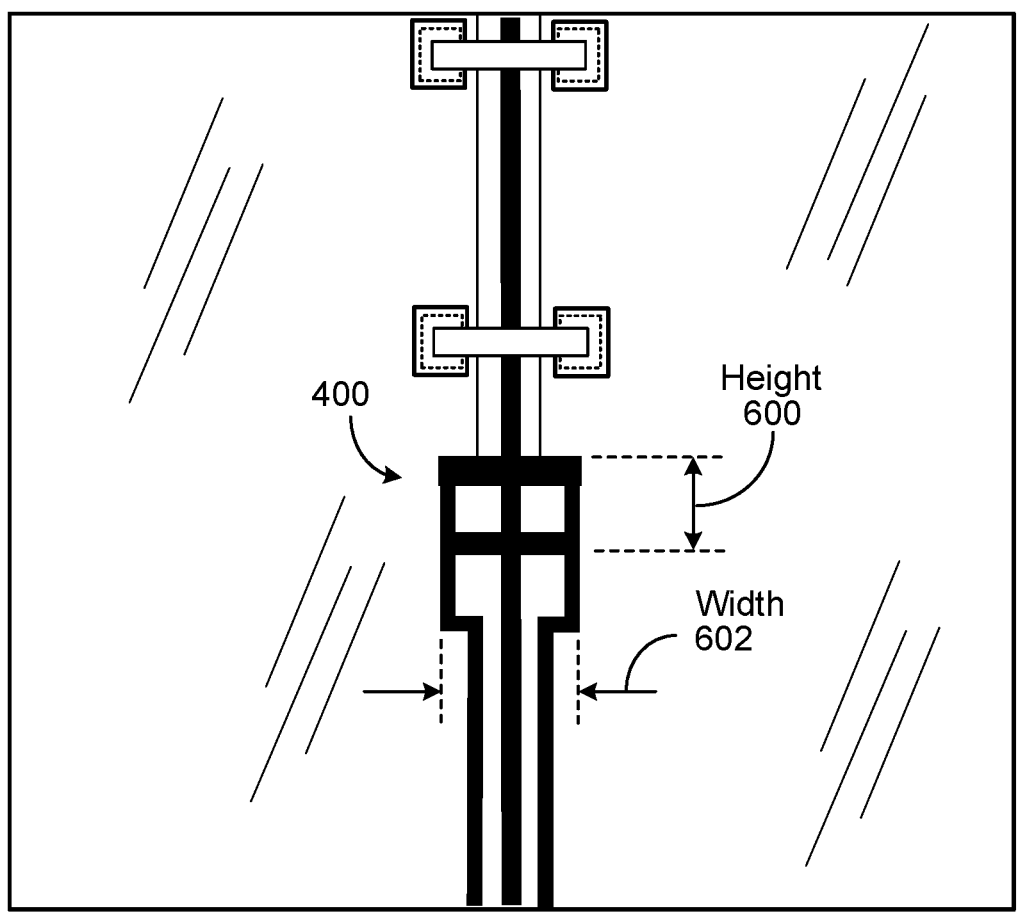
FIG. 6 is a schematic that illustrates a top view of an exemplary qubit bias control device that is coupled to an end of a co-planar waveguide.
Figure 7A:
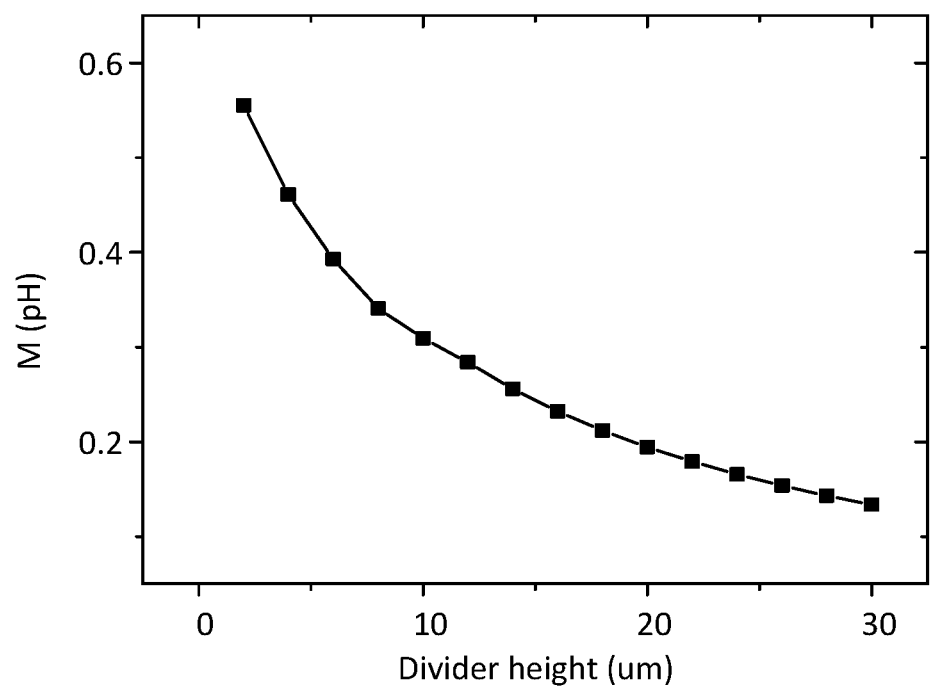
FIG. 7A is a plot that depicts the mutual inductance M calculated for a qubit bias control device having the design shown in FIG. 6.
Figure 7B:
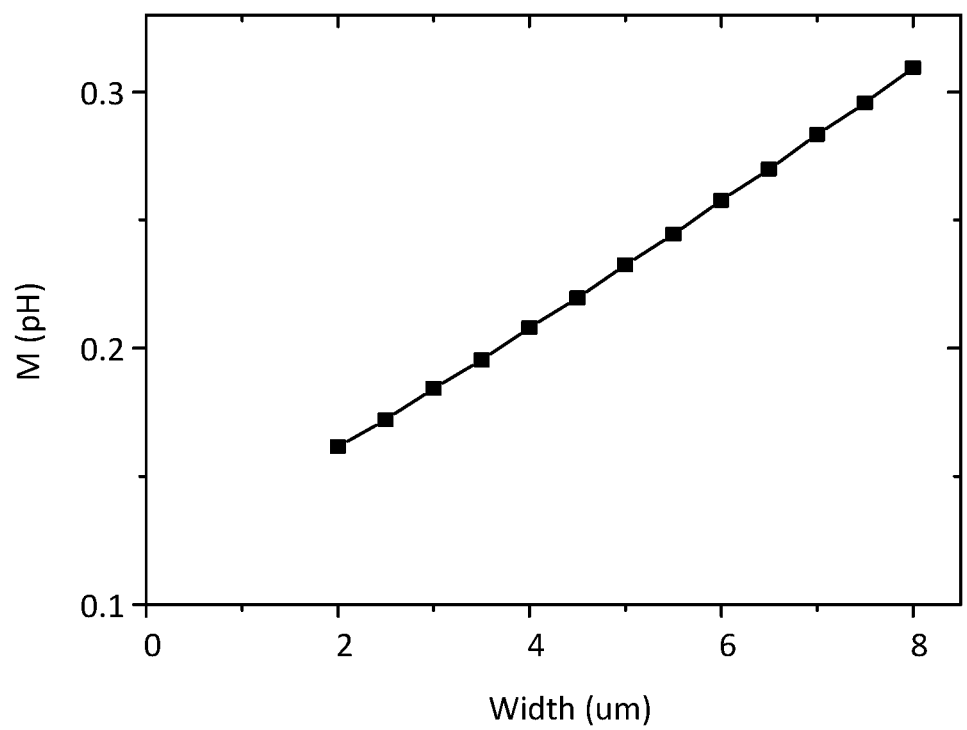
FIG. 7B is a plot that depicts the mutual inductance M calculated for a qubit bias control device having the design shown in FIG. 6.

FIG. 7A is a plot that depicts the mutual inductance M calculated for a qubit bias control device having the design shown in FIG. 6, at a fixed width 602 of 20 microns. As shown in the plot, increasing the divider height from about 5 µm to about 30 µm decreases the mutual inductance from about 0.6 pH to close to about 0.1 pH. FIG. 7B is a plot that depicts the mutual inductance M calculated for a qubit bias control device having the design shown in FIG. 6, at a fixed height 600 of 10 microns. As shown in the plot, increasing the divider width from about 2 µm to about 8 µm increases the mutual inductance from about 0.1 pH to about 0.3 pH.

Table 1 below includes the mutual coupling values and qubit decoherence lifetimes as calculated for a co-planar waveguide flux qubit having the design shown in FIG. 6. As shown in the table, for mutual coupling values close to 0.1 pH, the qubit decoherence lifetimes can be increased up to, e.g., 100 µs.

TABLE 1

| Z0 (ohm) | 68 | 107 | 165 |
|---|---|---|---|
| Mutual coupling (pH) | 0.66 | 0.83 | 1.03 |
| Qubit lifetime (µs) | | 4 | |
| Mutual coupling (pH) | 0.33 | 0.42 | 0.50 |
| Qubit lifetime (µs) | | 16 | |
| Mutual coupling (pH) | 0.13 | 0.17 | 0.21 |
| Qubit lifetime (µs) | | 100 | |

Figure 8:
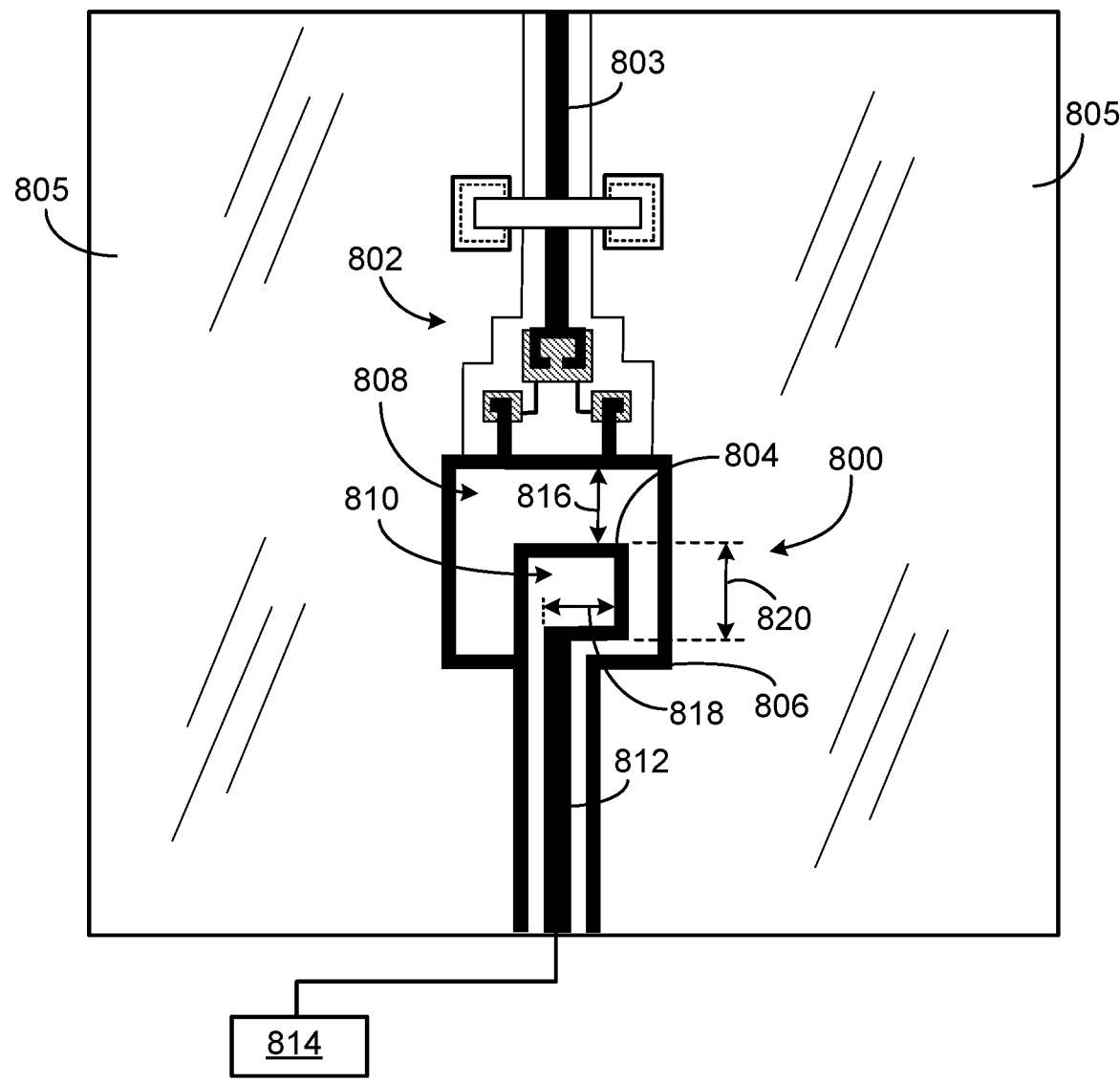
FIG. 8 is a schematic that illustrates a top view of an exemplary SQUID bias control device that is coupled to a DC-SQUID of a co-planar waveguide flux qubit.

FIG. 8 is a schematic that illustrates a top view of an exemplary SQUID bias control device 800 that is coupled to the DC-SQUID 802 of a co-planar waveguide flux qubit according to the present disclosure. For ease of viewing, only a portion of the co-planar waveguide 803 is shown. The other end of the waveguide 803 may be coupled to the qubit bias control device. The SQUID bias control device 800 includes an inner thin film loop 804 and an outer thin film loop 806 that at least partially circumscribes the inner thin film loop 804 and that is in electrical contact with the DC-SQUID 802. Both the inner thin film loop 804 and the outer thin film loop 806 are formed from a superconducting thin film on the substrate surface. For instance, the inner thin film loop 804 and the outer thin film loop 806 can be formed from the same superconducting material as the waveguide and DC-SQUID. The area between the inner and outer thin film loops corresponds to an outer gap area 808, whereas the area within the inner thin film loop corresponds to an inner gap area 810. Both the inner and outer gap areas 808, 810 correspond to a vacuum. One end of the inner thin film loop 804 is in electrical contact with a drive line 812. The drive line 812 is coupled to a current source 814. The current source 814 may be fabricated on the same chip/substrate as the flux qubit or it may be an external source that is electrically coupled to the chip. The other opposite end of the inner thin film loop 804 is in electrical contact with the outer thin film loop 806. The outer thin film loop 806 is in electrical contact with the loop of the DC-SQUID 802 and in electrical contact with the ground-plane 805.

In some implementations, the SQUID bias control device 800 enables sufficiently strong coupling (e.g., between about 1-2 pH) to the DC-SQUID loop while weakly coupled with the CPW mode of the co-planar waveguide, which can otherwise be a source of cross-talk and decoherence. Several aspects of the SQUID bias control device 800 can be varied to achieve sufficient coupling to the DC-SQUID, while reducing coupling to the CPW mode of the co-planar waveguide. For example, a first variable aspect is the distance of the outer gap area 808 between the outer thin film loop 804 and the inner thin film loop 802. For a SQUID bias control device formed from rectilinear inner and outer loops, such as that shown in FIG. 8, the size of the outer gap area 808 can be adjusted by changing the distance 816 between the inner and outer thin film loops. By altering the distance 816, the coupling strength can be varied. With increasing distance, the coupling strength increases and eventually saturates at a value dependent on the particular device design.

A second variable aspect is the size of the inner gap area 810. Altering the inner gap area 810 can actually modify two different features of the SQUID bias control device 800. For example, by varying the distance 818 that the inner thin film loop 804 extends laterally from the drive line 812, it is possible to vary how strongly the SQUID bias control device couples to the CPW mode of the co-planar waveguide 802. Indeed, for certain distances 818, the coupling to the CPW mode may be reduced to zero. In addition, it is possible to modify the sensitivity of the SQUID bias control device 800 to imperfections in the device fabrication. In particular, by adjusting the distance 820 between the upper and lower portions of the inner thin film loop 804, it is possible to alter how strongly the coupling to the CPW mode and the coupling to the DC-SQUID vary with a change in the distances 816, 818. In other words, the SQUID bias control device 800 can be designed so that even if there are relatively significant variations in the structure of the fabricated device from the intended device design, the desired coupling to the DC-SQUID and CPW mode will not be significantly altered.

Figure 9A:
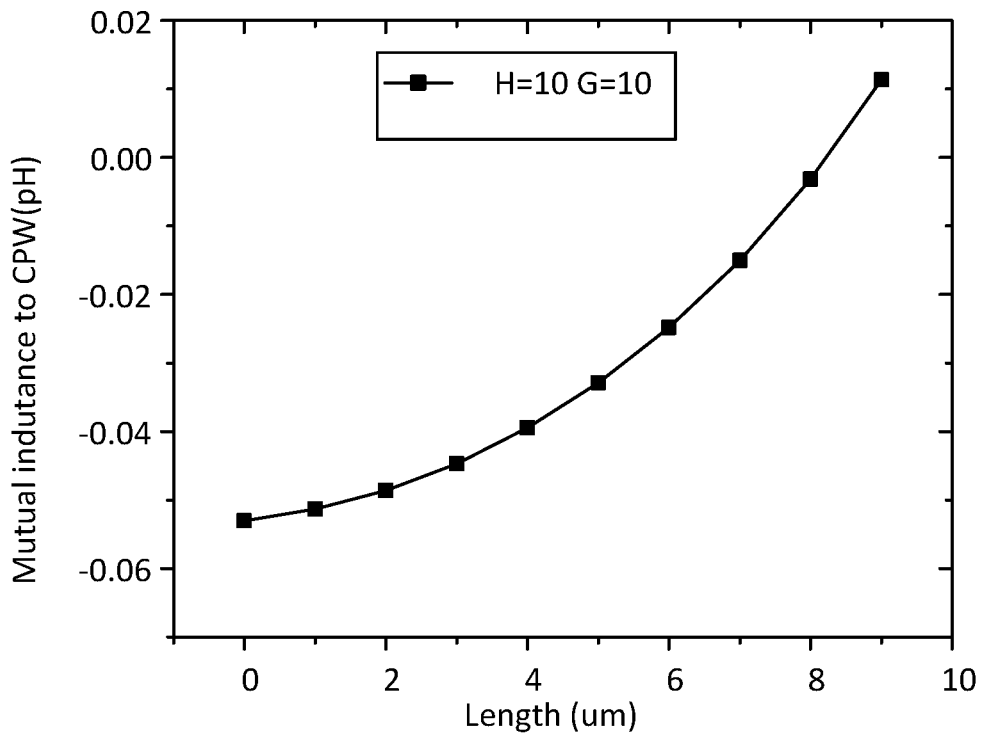
FIG. 9A is a plot that depicts the mutual inductance to the CPW mode of a co-planar waveguide as calculated for a SQUID control device having the design shown in FIG. 8.
Figure 9B:
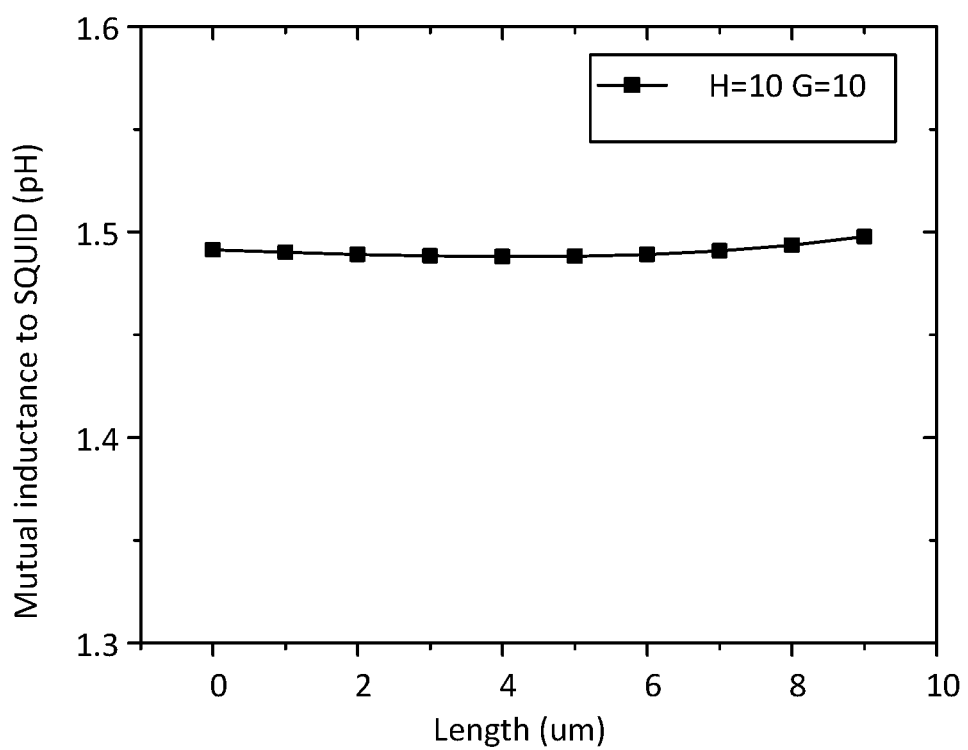
FIG. 9B is a plot that depicts the mutual inductance to a DC-SQUID as calculated for a SQUID control device having the design shown in FIG. 8.

FIG. 9A is a plot that depicts the mutual inductance to the CPW mode of the co-planar waveguide versus the length 818 as calculated for a SQUID control device having the design shown in FIG. 8. As shown in the plot, the mutual inductance can be reduced to zero at around a length of 8 µm for a distance 816 (G in the plot) and a distance 820 (H in the plot) each equal to 10 µm. FIG. 9B is a plot that depicts the mutual inductance to the DC-SQUID versus the length 818 as calculated for a SQUID control device having the design shown in FIG. 8. As shown in the plot, when the distance 816 (G in the plot) and a distance 820 (H in the plot) are each equal to 10 µm, the mutual inductance is fairly constant even as the length 818 changes by one order of magnitude.

Multi-Branched Co-Planar Waveguide Flux Qubit

As explained above in reference to FIG. 2, the co-planar waveguide flux qubit includes a single elongated waveguide for coupling to other qubits within a quantum processor. However, the flux qubit design is not limited to a single waveguide. Instead, a flux qubit may include multiple co-planar waveguides that are coupled to the DC-SQUID. The multi-waveguide flux qubit design has several advantages compared to the single waveguide design including, for example: (1) the ability to couple to an even greater number of qubits in a fully connected setting (e.g., using two waveguides rather than one waveguide may double the number of qubits to which one can couple in a fully connected quantum processor); (2) enabling readout/measurement and bias lines to be coupled to different co-planar waveguides of each qubit, thus reducing cross talk; and (3) the ability to compensate for asymmetry in mutual inductance coupling between qubits, allowing inter-coupling of more qubits. Indeed, for co-planar waveguide flux qubits having a symmetrical arrangement of waveguide resonators, the mutual coupling between the co-planar waveguides may, in certain implementations, result in an even stronger $\sigma_x\sigma_x$ coupling between qubits.

Figure 10A:
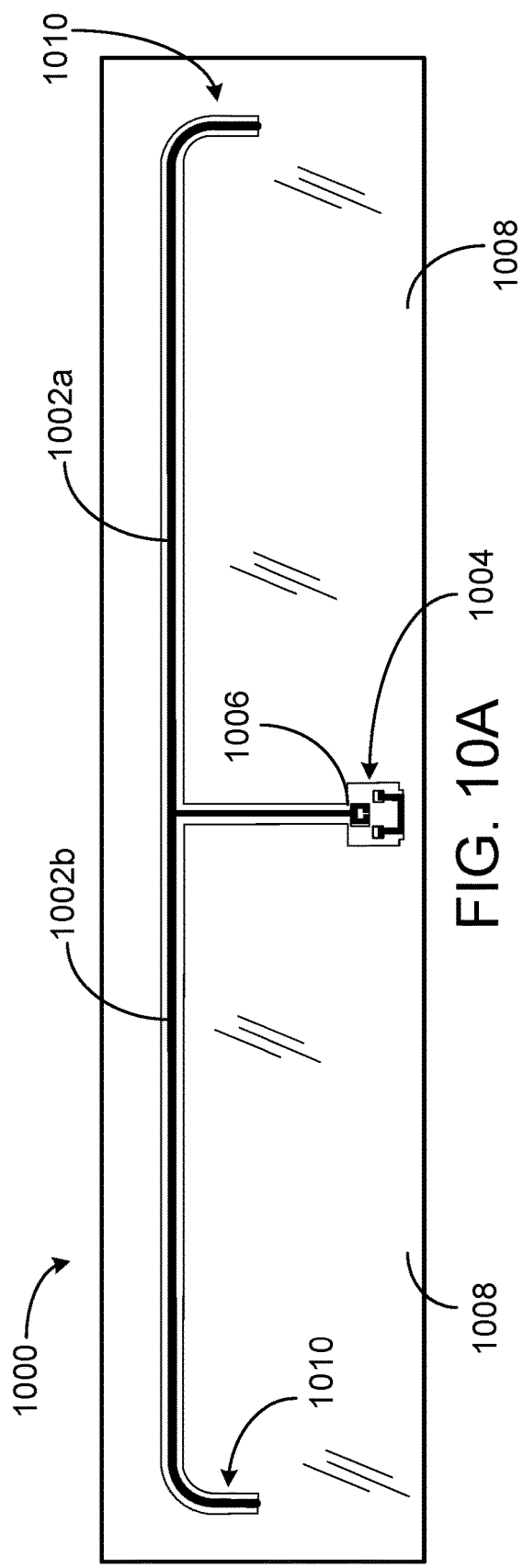
FIG. 10A is a schematic that illustrates an example of a multi-co-planar waveguide flux qubit that includes a DC-SQUID in electrical contact with/coupled to two grounded co-planar waveguides.

FIG. 10A is a schematic that illustrates a top view of an exemplary multi-co-planar waveguide flux qubit 1000 that includes a DC-SQUID 1004 in electrical contact with two co-planar waveguides 1002a and 1002b. The multi-waveguide flux qubit 1000 may be fabricated on a dielectric substrate (e.g., sapphire) using thin-film processing in a substantially same manner with the same or similar materials as the flux qubit disclosed herein with respect to FIG. 2. Each waveguide 1002a, 1002b joins the DC-SQUID 1004 at a common point 1006, whereas the opposite ends of each waveguide 1002a, 1002b are grounded to ground-plane 1008. Aside from the electrical connections to the ground-plane 1008 and the DC-SQUID 1004, the waveguides 1002a, 1002b are separated on either side from the thin-film ground-plane 1008 by a gap having a constant width. Each waveguide 1002a, 1002b also includes a hooked or bent region 1010 near the connection to the ground-plane 1008 that can be used, e.g., for coupling to a readout device.

Figure 10B:
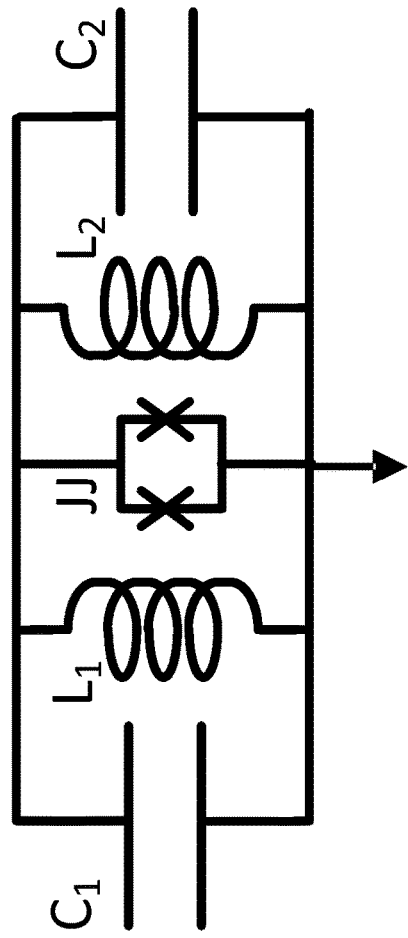
FIG. 10B is a circuit diagram representative of the co-planar waveguide flux qubit of FIG. 10A.

FIG. 10B is a circuit diagram representative of the co-planar waveguide flux qubit of FIG. 10A. Compared to the schematic of FIG. 2C for the single waveguide flux qubit, the circuit shown in FIG. 10B includes an additional parallel capacitance $C_2$ and inductance $L_1$ due to the added co-planar waveguide coupled to the DC-SQUID. An example of the Hamiltonian describing the flux qubit depicted in FIG. 10B can be derived as follows. First, the classical circuit equation for the circuit schematic shown in FIG. 10B is set forth as:

$$(C_1 + C_2)\ddot{\Phi} = \frac{\Phi - \Phi_x^1}{L_1} + \frac{\Phi - \Phi_x^2}{L_2} + I_0 \sin\left(\frac{2\pi}{\Phi_0}\Phi\right), \quad (3)$$

Where $I_0$ is the critical current of the Josephson junction, $\Phi$ is the flux difference across the junction, and $\Phi_0$ is the flux quantum, which results in the Hamiltonian $$H = \frac{Q^2}{2C} + \frac{(\Phi - \Phi_x)^2}{2L} - \frac{I_0 \Phi_0}{2\pi}\cos(\Phi), \quad (4)$$

where $L = L_1 L_2/(L_1 + L_2)$, $C = C_1 + C_2$, $Q$ is charge, and $$\Phi_x = \frac{L_1 \Phi_x^2 + L_2 \Phi_x^1}{L_1 + L_2}.$$

The flux threading the multi-waveguide flux qubit is redefined by biasing the above circuit at external flux $\Phi_x = \Phi_0/2$. Introducing the dimensionless variables $$\phi = \frac{2\pi}{\Phi_0}\Phi + \pi,$$

the Hamiltonian can be expressed as:

$$H = 8E_C \frac{q^2}{2} + \frac{E_L(\phi - \phi_x)^2}{2} + \beta E_L \cos(\phi) \text{ with} \quad (5),$$

$$E_L = \frac{(\Phi_0/2\pi)^2}{L}, E_C = \frac{e^2}{2C}, \text{ and } \beta = \frac{2\pi I_0 L}{\Phi_0},$$

where e is the charge of an electron. The double-well potential of the flux qubit emerges at $\beta > 1$. Though the flux qubit 1000 is shown with only two co-planar waveguides, the design can be readily extended to include additional co-planar waveguides, thus enabling more complex architectures.

Figure 11:
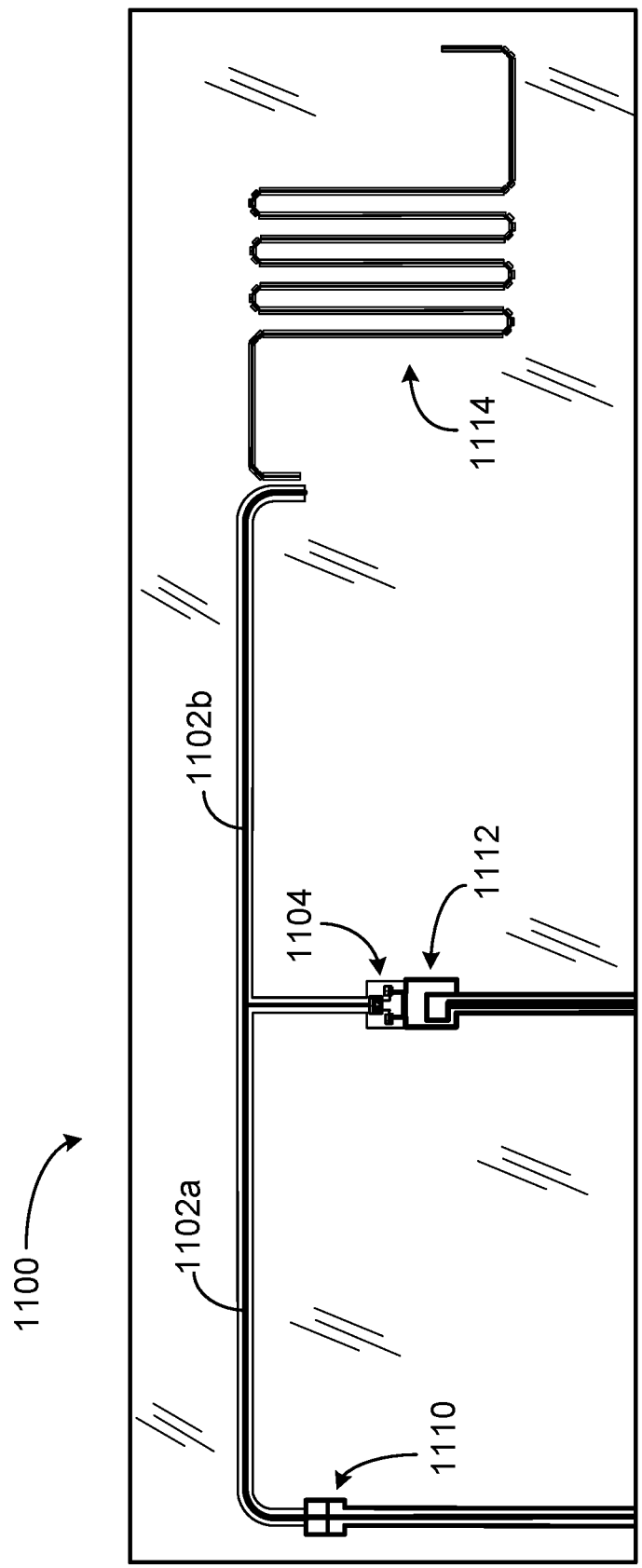
FIG. 11 is a schematic that illustrates a top view of an exemplary multi-branched flux qubit.

As explained above, a potential advantage of the multi-waveguide flux qubit is that readout/measurement and bias may be performed using different co-planar waveguides for an individual qubit, thus reducing cross talk. FIG. 11 is a schematic that illustrates a top view of an exemplary multi-branched flux qubit 1100 that separates the readout and bias operations along different waveguides of the qubit. The flux qubit 1100 may also be fabricated on a dielectric substrate (e.g., sapphire) using thin-film processing in substantially the same manner and using the same or similar materials as the flux qubits disclosed herein with respect to FIGS. 2 and 10A. The flux qubit 1100 has the same configuration as the flux qubit 1000 shown in FIG. 10A. The flux qubit 1100 also includes a qubit bias control device 1110 in electrical contact with an end of the first co-planar waveguide 1102a, as well as a SQUID bias control device 1112 in electrical contact with the DC-SQUID 1104.

The second co-planar waveguide 1102b of the flux qubit 1100 is arranged within a coupling distance of a readout device 1114. During a readout operation, the readout device 1114 reads the state of qubit 1100. In the context of a quantum processor, readout devices such as device 1114 are used to read out the final state of the qubit to produce, e.g., a bit string. In the implementation shown in FIG. 11, the readout device 1114 includes an elongated thin film superconductor (e.g., aluminum or niobium) that is arranged on the dielectric substrate in a serpentine pattern and that is configured to inductively couple from a first end to the second waveguide 1102b of flux qubit 1100. That is, the readout device 1114 is not in direct electrical connection with the waveguide 1102b (other than through the relatively weak electric connection of ground plane 1106), but may, during user, be inductively coupled to qubit 1100 through waveguide 1102b. The separation between the co-planar waveguide and the readout device may be, e.g., about 2 microns. At a second opposite end of the readout device 1114, the readout device may be further coupled to other elements that are formed on the substrate/chip or externally to the substrate/chip, such as routing circuitry (e.g., latching elements, a shift register, or a multiplexer circuit).

Connected Quantum Network Using Co-planar Waveguide Flux Qubits

In some implementations, multiple co-planar waveguide flux qubits are arranged on a substrate surface to form an interconnected quantum processor network. Such quantum processor networks may be used in quantum computing applications including, e.g., quantum annealing and/or adiabatic quantum computing. For example, in some implementations, a quantum processor network may be initialized with a problem Hamiltonian and adiabatically evolved to a desired Hamiltonian whose ground state describes the solution to a problem of interest.

Figure 12:
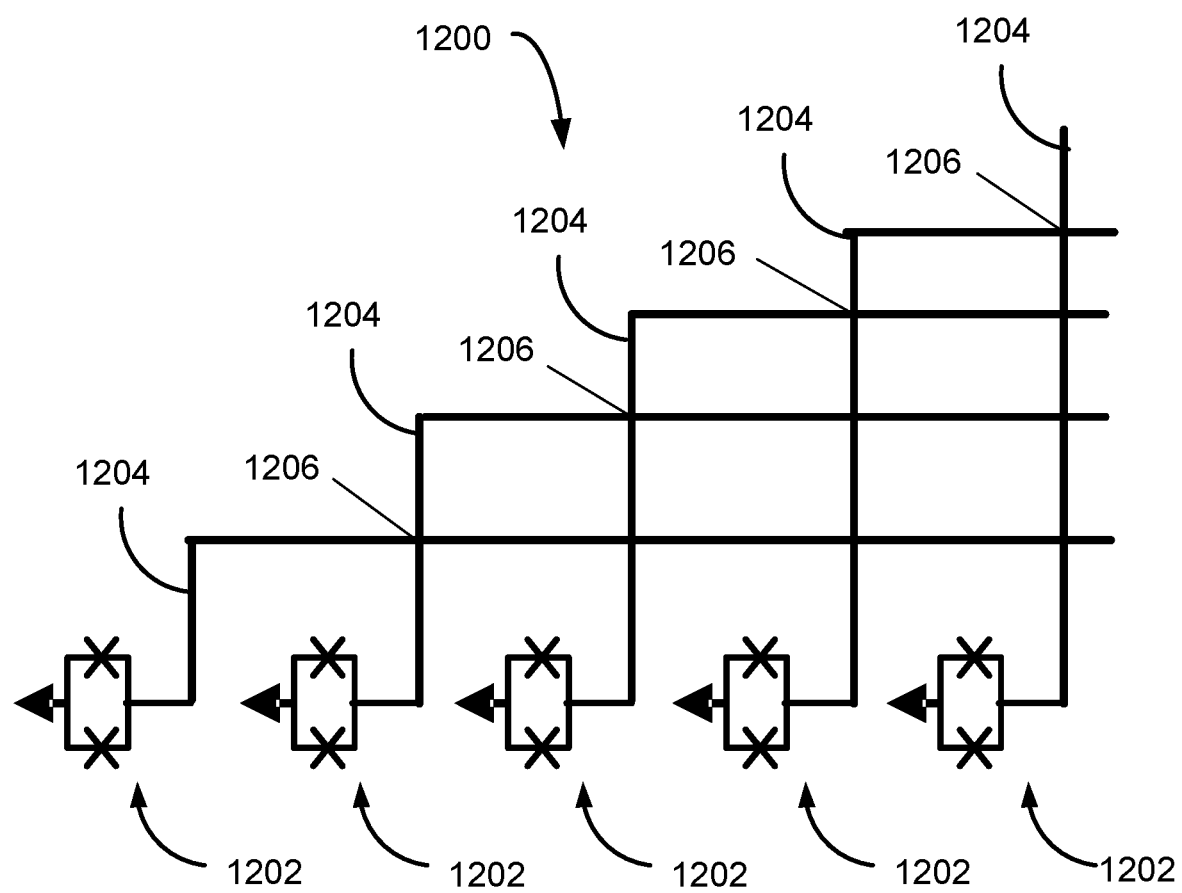
FIG. 12 is a schematic that illustrates a network diagram of an exemplary network of interconnected single-branched co-planar waveguide flux qubits.

Various different network configurations that employ the flux qubit designs according to the present disclosure are possible. For instance, FIG. 12 is a schematic that illustrates a network diagram of an exemplary network 1200 of fully interconnected single-branched co-planar waveguide flux qubits 1202. Each flux qubit 1202 includes a single corresponding co-planar waveguide 1204, through which the qubit may be inductively coupled to every other qubit in the network 1200 at points 1206 where the waveguides cross in the schematic. The co-planar waveguides do not physically contact one another at points 1206. Rather, a separate superconducting thin-film coupler is fabricated adjacent to each waveguide so as to enable inductive coupling between the waveguides. Although not shown in FIG. 12, each flux qubit also may include a corresponding qubit bias control device and a SQUID bias control device such as described herein. Each flux qubit may also include a qubit readout device inductively coupled to an end of the flux qubit waveguide. With the relatively straightforward arrangement of co-planar waveguide flux qubits shown in FIG. 14, it is possible to substantially increase the number of fully coupled qubits within a quantum processor. For example, a quantum processor containing 32 fully coupled co-planar waveguide flux qubits arranged in the configuration shown in FIG. 14 would, in certain implementations, have the same quantum processing capability as a quantum processor relying on 1000 persistent current flux qubits using a nearest neighbor coupling arrangement.

Figure 13:
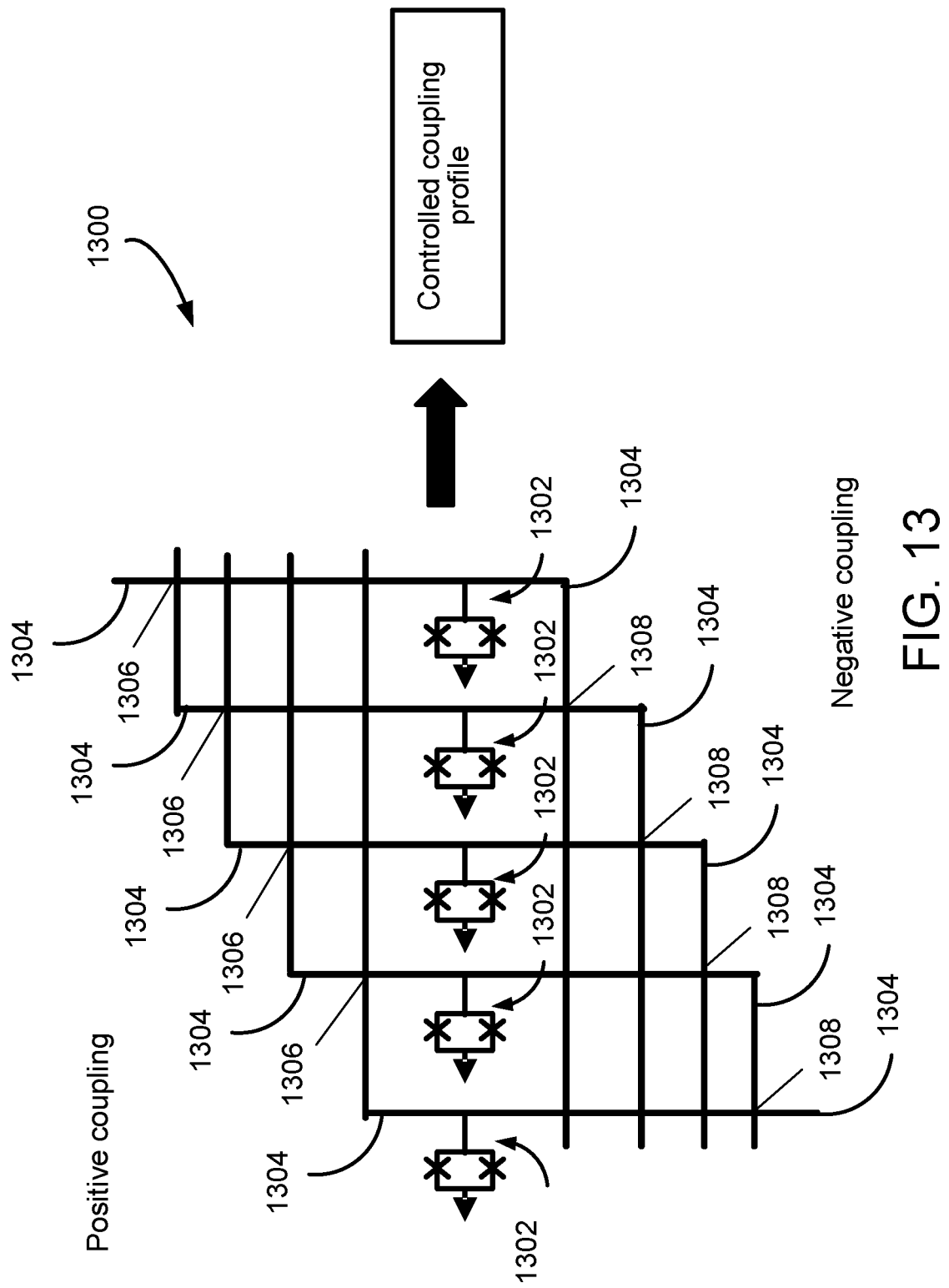
FIG. 13 is a schematic that illustrates a network diagram of exemplary network of interconnected multi-branched co-planar waveguide flux qubits.

In some implementations, multi-branched flux qubits can be used in the quantum processor. FIG. 13 is a schematic that illustrates a network diagram of exemplary network 1300 of interconnected multi-branched co-planar waveguide flux qubits. The sign of the mutual inductances (top branch and bottom branch) can be positive or negative, the sum of which in turn determines the sign of the total qubit-qubit coupling. Thus, as shown in FIG. 13, each flux qubit 1302 includes a corresponding double branched co-planar waveguide 1304, in which a first branch of the waveguide couples positively at points 1306 to respective first branches of other qubits 1302 in the network 1300. A second branch of each waveguide couples negatively at points 1308 to respective second branches of the other qubits 1302 in the network 1300. Again, separate superconducting thin-film couplers are fabricated adjacent to each waveguide so as to enable inductive coupling between the waveguides.

Figure 14:
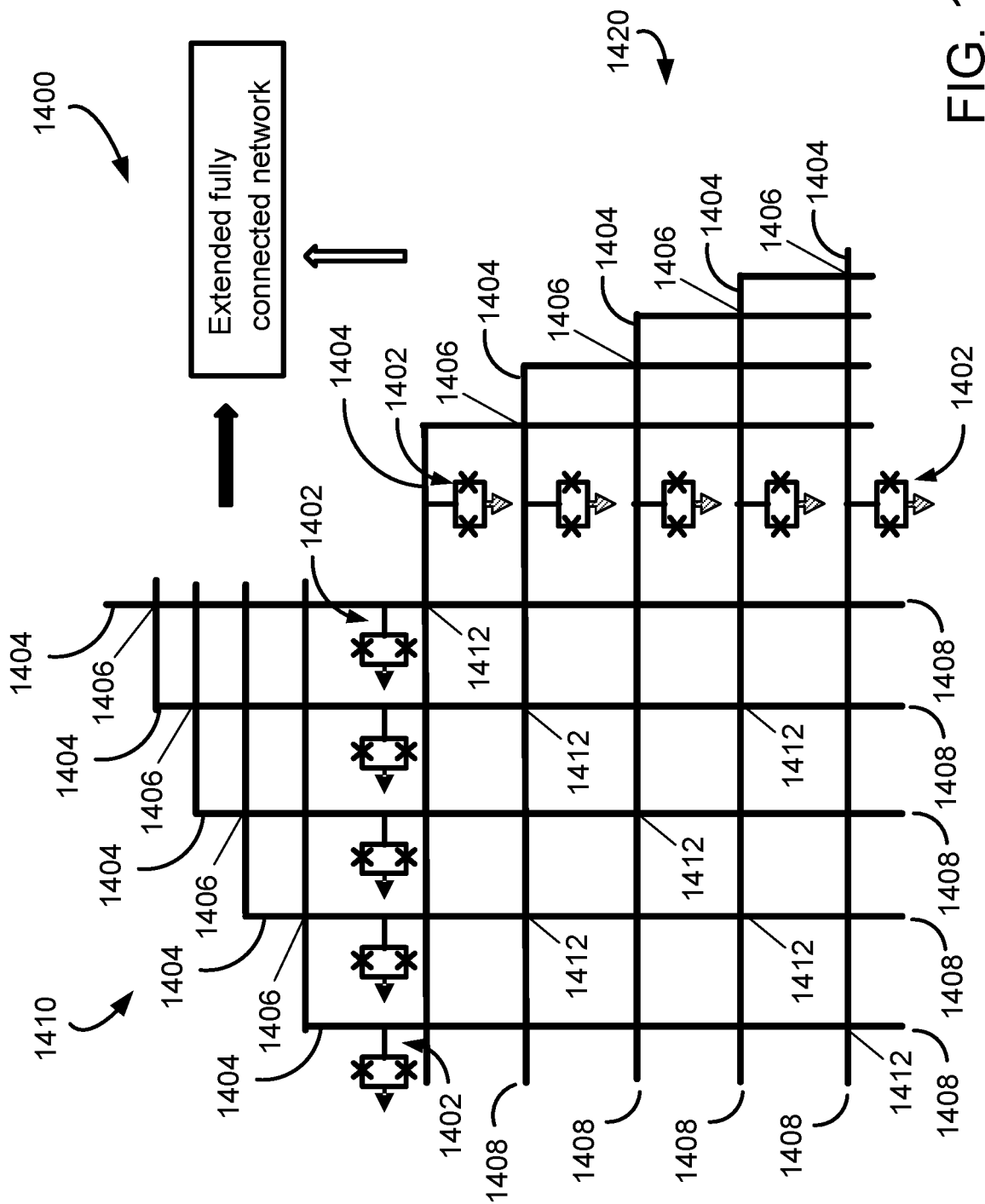
FIG. 14 is a schematic that illustrates a network diagram of an exemplary fully connected quantum network of self-connected multi-branched co-planar waveguide flux qubits.

FIG. 14 is a schematic that illustrates a network diagram of another exemplary network 1400 of interconnected multi-branched co-planar waveguide flux qubits. As shown in FIG. 14, the total number of interconnected qubits can be expanded by coupling a first fully connected network 1410 of qubits to a second fully connected network 1420 of qubits. A "fully connected qubit network" is a network in which each qubit is arranged so that it can, during operation of the network, couple to each other qubit in the network. Each qubit 1402 in network 1410 includes a corresponding double branched co-planar waveguide, in which a first branch 1404 of the waveguide couples at points 1406 to respective first branches of other qubits 1402 in the network 1410. Similarly, each qubit 1402 in network 1420 includes a corresponding double branched co-planar waveguide, in which a first branch 1404 of the waveguide couples at points 1406 to respective first branches of other qubits 1402 in the network 1420. Both networks 1410, 1420 are then arranged so that a second branch 1408 of each waveguide from the first network 1410 couples to the second branch 1408 of each waveguide from the second network 1420 at coupling points 1412. Again, separate superconducting thin-film couplers are fabricated adjacent to each waveguide so as to enable inductive coupling between the waveguides. Additionally, each qubit may include a corresponding qubit bias control device and a SQUID bias control device such as described herein (not shown in FIG. 14). Each flux qubit may also include a corresponding readout device (not shown) inductively coupled to a first waveguide branch of the qubit. While the portion of the quantum processors shown in FIGS. 12-14 includes only a limited number qubits, the quantum processors may include any desired number of qubits that can be adequately fabricated and arranged on a selected substrate surface.

Figure 15A:
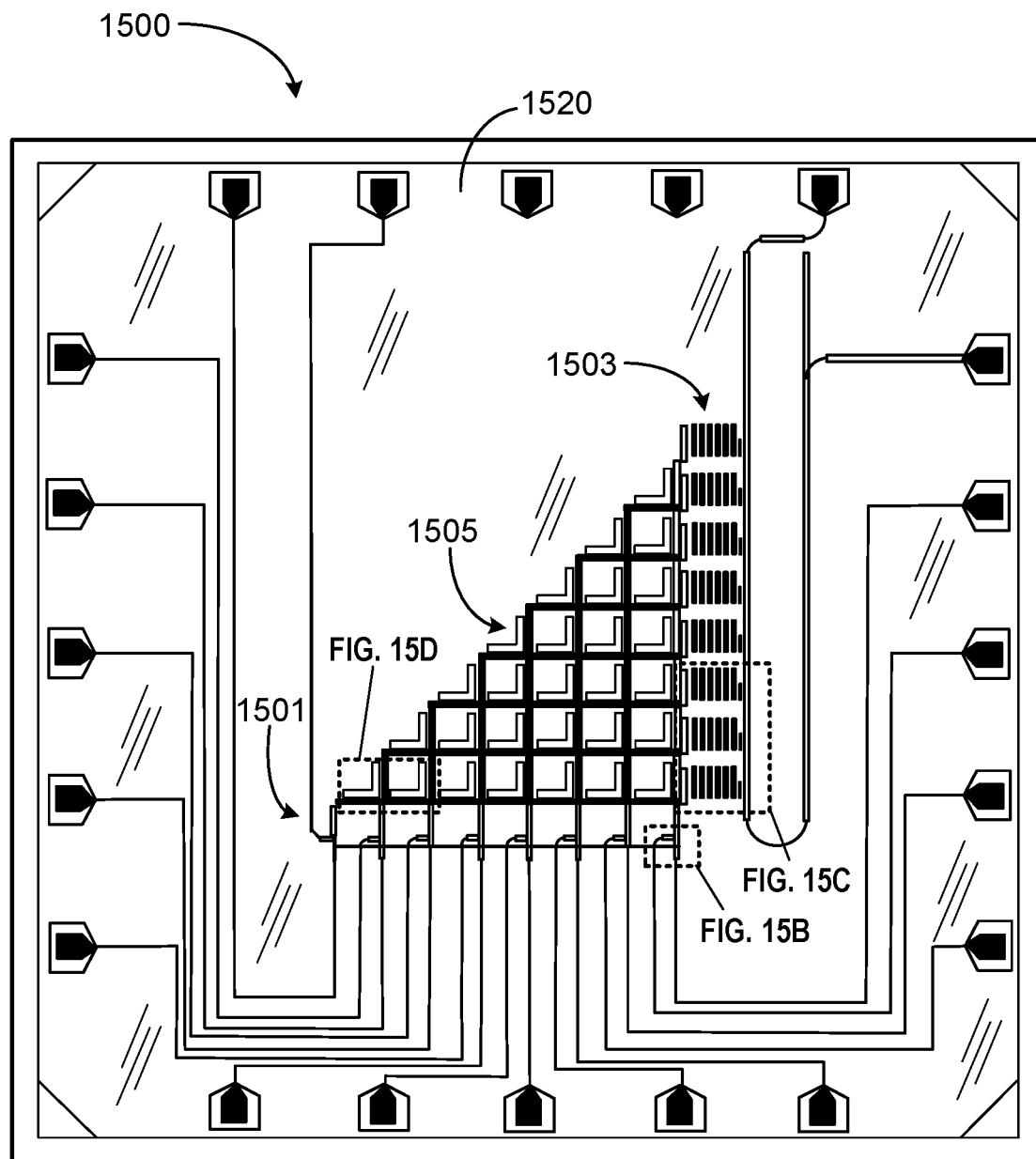
FIG. 15A is a computer aided design schematic illustrating a top view of an exemplary quantum processor layout 1500 that relies on an interconnected network of co-planar waveguide flux qubits.
Figure 15B:
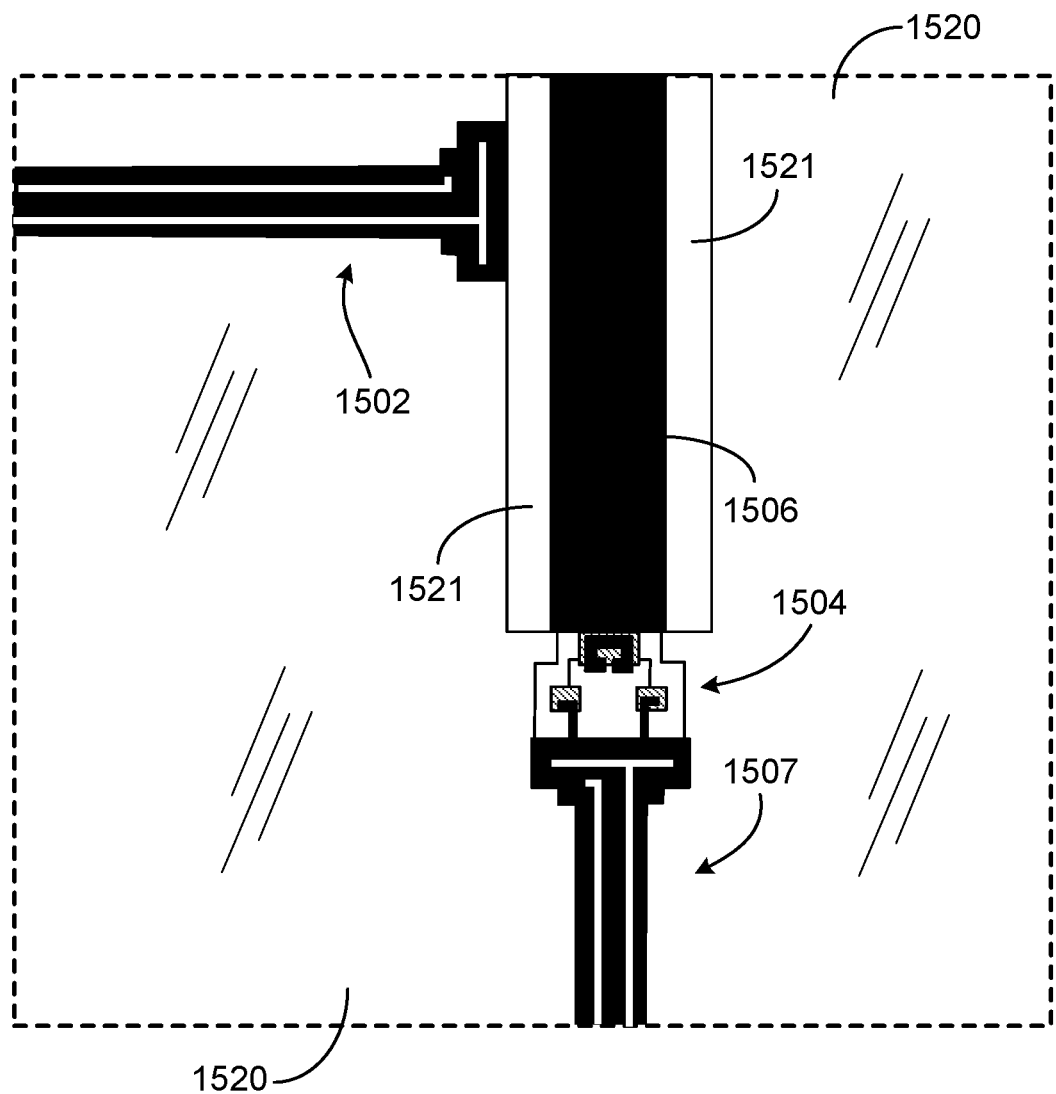
FIG. 15B is a schematic illustrating an enlarged view of a single co-planar waveguide that is coupled to a qubit bias control device and SQUID bias control device of FIG. 15A.

FIG. 15A is a computer aided design schematic illustrating a top view of an exemplary quantum processor layout 1500 that relies on an interconnected network of co-planar waveguide flux qubits. The quantum processor 1500 includes a ground plane 1520 that covers a large area of the substrate surface and can be divided into several different regions. For example, the processor 1500 may include a control region 1501 containing an array of qubit bias control devices and SQUID bias control devices. Each co-planar waveguide in the processor layout is arranged adjacent so that it couples to a corresponding qubit bias control device and SQUID bias control device from the control region 1501. FIG. 15B shows an enlarged view of a single co-planar waveguide 1506 that is arranged so that it can be inductively coupled to a qubit bias control device 1502 and is in electrical contact with a DC-SQUID 1504. The DC-SQUID 1504 is arranged so it can be inductively coupled to a SQUID bias control device 1507. The waveguide 1506 is separated from ground plane 1520 by a gap 1521 on both of its elongated sides. The waveguide 1506, DC-SQUID 1504, qubit bias control device 1502 and SQUID bias control device 1507 may be designed and fabricated in accordance with the present disclosure.

Figure 15C:
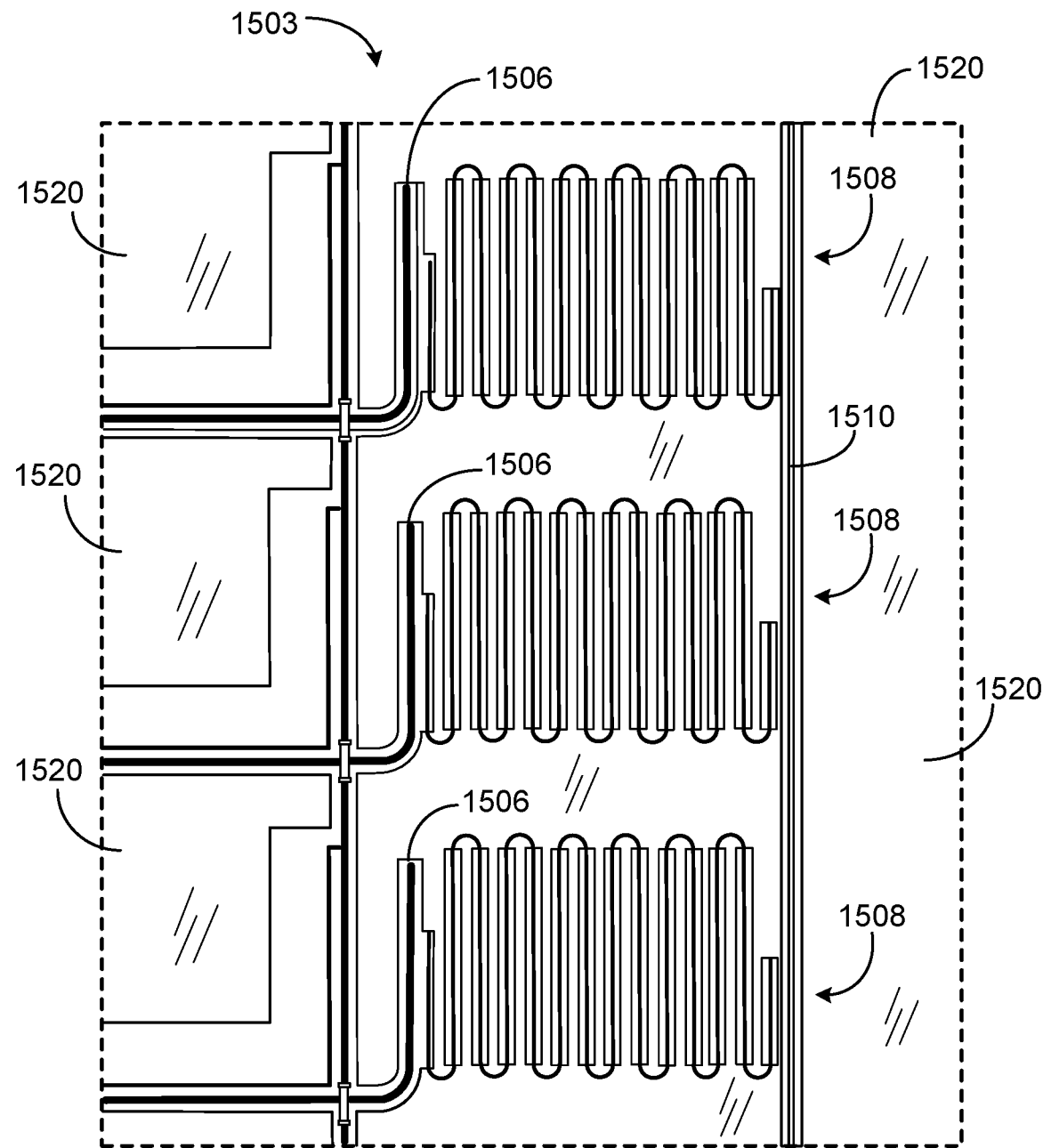
FIG. 15C is a schematic illustrating an enlarged view of a portion of the readout device region of FIG. 15A.

The processor 1500 may also include a readout device region 1503. An enlarged view of a portion of the readout device region 1503 including readout devices 1508 is shown in FIG. 15C. The readout device region 1503 includes multiple readout devices 1508, each of which is arranged adjacent to a corresponding co-planar waveguide 1506 so that the readout device can inductively couple to the waveguide 1506. Each readout device 1508 in turn is arranged so it can inductively couple to a readout line 1510. Readout line 1510 is separated from the ground plane 1520 on both of its elongated sides by a small gap (e.g., between about 1-5 microns).

Figure 15D:
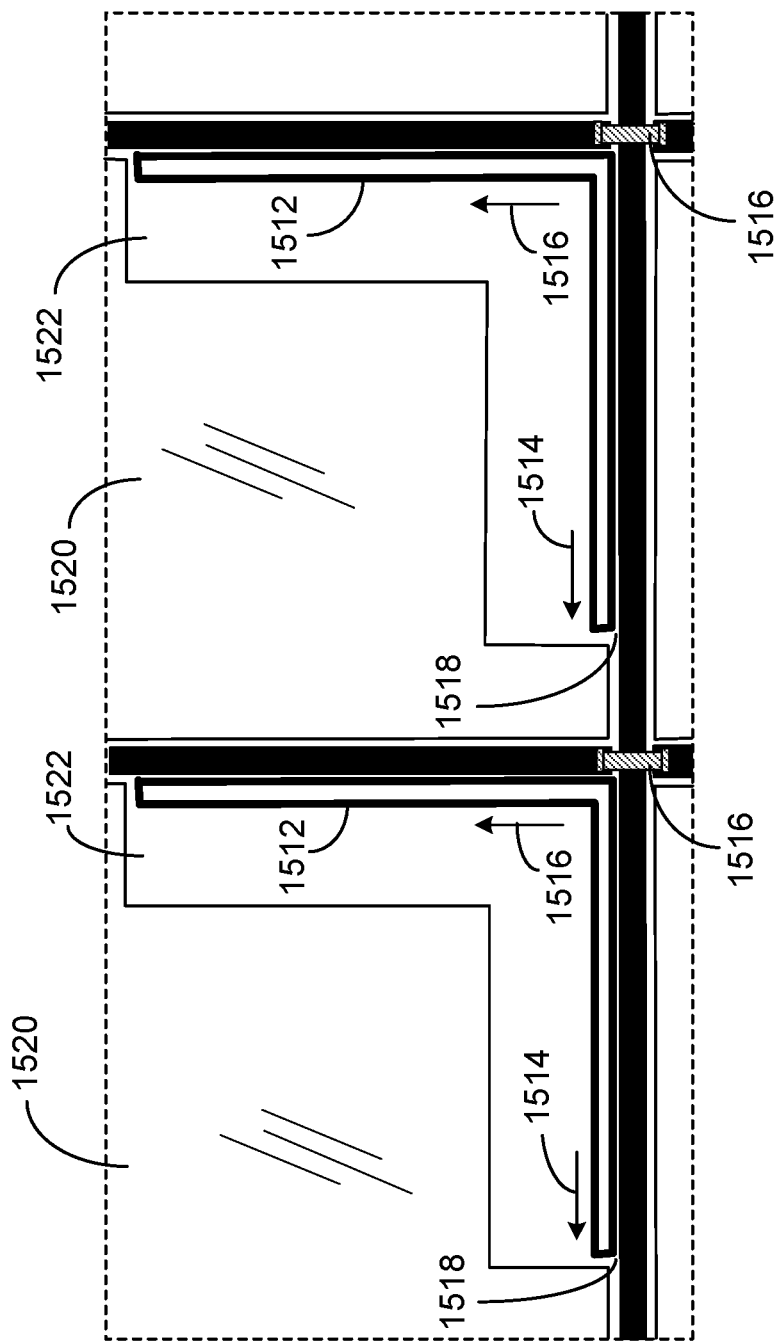
FIG. 15D is a schematic illustrating an enlarged view of a portion of the coupling region of the quantum processor of FIG. 15A.

The processor 1500 also may include a coupling region 1505. The coupling region 1505 corresponds to the area where the co-planar waveguides of each flux qubit are arranged to couple to one another. An enlarged view of a portion of the coupling region 1505 is shown in FIG. 15D. At each crossing of the co-planar waveguides, a superconducting thin-film coupler 1512 is placed adjacent to waveguides. The superconducting thin film coupler 1512 includes a loop of superconducting material, in which a first portion of the loop extends in a first direction 1514 along a first waveguide and a second portion of the loop extends in a second orthogonal direction 1516 along a second waveguide, with a right angle bend where the first and second waveguide cross. The waveguides are not in electrical contact at the crossing. Rather, a cross-over air-bridge 1516 may be used as a jumper for a first waveguide to pass over the second waveguide at the crossing. The loop 1512 is separated from each waveguide by a thin gap 1518 (e.g., on the order of a few microns). During operation of the processor, energy from one waveguide couples to the superconducting thin film coupler 1512, which then is coupled to a second waveguide arranged near the coupler 1512. The coupler 1512 also is separated from the ground plane 1520 by a larger gap 1522. The coupler 1512 can be defined with three parameters: a trace width W, a loop arm length L and a gap distance G (i.e., the interior distance between loop arms). The trace width W may be, in some implementations, in the range of about 1-5 microns. The loop arm length L may be, in some implementations, on the order of few hundred microns, depending on the number of qubits in the network. The gap distance G may be, in some implementations, on the order of few tens of microns. Other ranges may also be used, depending on the design criteria.

Embodiments of the digital and quantum subject matter and the digital functional operations and quantum operations described in this specification can be implemented in digital electronic circuitry, suitable quantum circuitry or, more generally, quantum computational systems, in tangibly-embodied digital or quantum computer software or firmware, in digital or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and quantum subject matter described in this specification can be implemented as one or more digital or quantum computer programs, i.e., one or more modules of digital or quantum computer program instructions encoded on a tangible non-transitory storage medium for execution by, or to control the operation of, data processing apparatus. The digital or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital or quantum information, e.g., a machine-generated electrical, optical, or electromagnetic signal, that is generated to encode digital or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital or quantum data processing hardware and encompasses all kinds of apparatus, devices, and machines for processing digital or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital or quantum computer program can be deployed to be executed on one digital or one quantum computer or on multiple digital or quantum computers that are located at one site or distributed across multiple sites and interconnected by a digital or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital or quantum computers, operating with one or more digital or quantum processors, as appropriate, executing one or more digital or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital or quantum computers.

For a system of one or more digital or quantum computers to be "configured to" perform particular operations or actions means that the system has installed on it software, firmware, hardware, or a combination of them that in operation cause the system to perform the operations or actions. For one or more digital or quantum computer programs to be configured to perform particular operations or actions means that the one or more programs include instructions that, when executed by digital or quantum data processing apparatus, cause the apparatus to perform the operations or actions. A quantum computer may receive instructions from a digital computer that, when executed by the quantum computing apparatus, cause the apparatus to perform the operations or actions.

Digital or quantum computers suitable for the execution of a digital or quantum computer program can be based on general or special purpose digital or quantum processors or both, or any other kind of central digital or quantum processing unit. Generally, a central digital or quantum processing unit will receive instructions and digital or quantum data from a read-only memory, a random access memory, or quantum systems suitable for transmitting quantum data, e.g. photons, or combinations thereof.

The essential elements of a digital or quantum computer are a central processing unit for performing or executing instructions and one or more memory devices for storing instructions and digital or quantum data. The central processing unit and the memory can be supplemented by, or incorporated in, special purpose logic circuitry or quantum simulators. Generally, a digital or quantum computer will also include, or be operatively coupled to receive digital or quantum data from or transfer digital or quantum data to, or both, one or more mass storage devices for storing digital or quantum data, e.g., magnetic, magneto-optical disks, optical disks, or quantum systems suitable for storing quantum information. However, a digital or quantum computer need not have such devices.

Digital or quantum computer-readable media suitable for storing digital or quantum computer program instructions and digital or quantum data include all forms of non-volatile digital or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital or quantum computer program product that includes instructions that are stored on one or more non-transitory machine-readable storage media, and that are executable on one or more digital or quantum processing devices. The systems described in this specification, or portions of them, can each be implemented as an apparatus, method, or system that may include one or more digital or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A qubit device comprising:
    an elongated thin film uninterrupted by Josephson junctions;
    a superconducting quantum interference device (SQUID) in direct electrical contact with a proximal end of the elongated thin film, wherein the SQUID comprises less than three Josephson junctions; and
    a ground plane that is co-planar with the elongated thin film and is in direct electrical contact with a distal end of the elongated thin film;
    wherein the elongated thin film, the SQUID and the ground plane comprise a superconductor material,
    wherein the elongated thin film comprises a first side and a second opposite side and wherein each of the first side and the second side is separated from the ground plane by a respective gap.

2. The qubit device of claim 1 wherein a width of each respective gap is constant along a length of the elongated thin film.

3. The qubit device of claim 1, wherein each of the elongated thin film, the SQUID, and the ground plane comprises aluminum or niobium.

4. The qubit device of claim 1, wherein the SQUID comprises a superconducting loop interrupted by the less than three Josephson junctions.

5. The qubit device of claim 4, wherein the SQUID comprises two Josephson junctions interrupting the superconducting loop.

6. The qubit device of claim 1, further comprising a substrate, wherein the elongated thin film, the ground plane and the SQUID are on a surface of the substrate.

7. The qubit device of claim 6, wherein the substrate is sapphire.

8. The qubit device of claim 1, wherein the elongated thin film comprises a first section extending away from the SQUID along a first direction and a second section extending away from the SQUID along a second direction different from the first direction.

9. The qubit device of claim 1, wherein the elongated thin film is a single-branched co-planar waveguide.

10. The qubit device of claim 1, wherein the elongated thin film is a double-branched co-planar waveguide.

11. A qubit control system comprising:
    a qubit comprising an elongated co-planar waveguide and a superconducting quantum interference device (SQUID), wherein a first end of the elongated co-planar waveguide is in direct electrical contact with the SQUID and a second end of the elongated co-planar waveguide is in direct electrical contact with a ground plane;
    a first bias control device arranged to electromagnetically couple to the elongated co- planar waveguide during operation of the qubit control system; and
    a second bias control device arranged adjacent to the SQUID to electromagnetically couple to the SQUID,
    wherein the elongated co-planar waveguide comprises an elongated thin film uninterrupted by Josephson junctions, wherein each of a first side of the elongated thin film and a second side of the elongated thin film is separated from the ground plane by a respective gap, wherein the first side of the elongated thin film is opposite to that of the second side of the elongated thin film.

12. An apparatus comprising:
a plurality of qubits, each qubit of the plurality of qubits comprising a corresponding elongated co-planar waveguide and a corresponding superconducting quantum interference device (SQUID), wherein, for each qubit, a first end of the corresponding elongated co-planar waveguide of the qubit is in direct electrical contact with the corresponding SQUID of the qubit, and a second end of the corresponding elongated co-planar waveguide of the qubit is in direct electrical contact with a ground plane,
wherein each qubit is operatively coupled to at least one other qubit of the plurality of qubits, and
wherein the corresponding co-planar waveguide of each qubit crosses over the corresponding co-planar waveguide of at least one other qubit of the plurality of qubits at a corresponding waveguide crossing location.

13. The apparatus of claim 12, comprising, at each waveguide crossing location, a corresponding coupling element arranged to electromagnetically couple the crossing co-planar waveguides at the waveguide crossing location.

* * * * *